(12) United States Patent
Liu

(10) Patent No.: US 12,155,362 B2
(45) Date of Patent: Nov. 26, 2024

(54) METHOD FOR FORMING BULK ACOUSTIC WAVE RESONANCE DEVICE

(71) Applicant: CHANGZHOU CHEMSEMI CO., LTD., Changzhou (CN)

(72) Inventor: Yuhao Liu, Shanghai (CN)

(73) Assignee: CHANGZHOU CHEMSEMI CO., LTD., Changzhou (CN)

( * ) Notice: Subject to any disclaimer, the term of this patent is extended or adjusted under 35 U.S.C. 154(b) by 474 days.

(21) Appl. No.: 17/640,802

(22) PCT Filed: Sep. 5, 2019

(86) PCT No.: PCT/CN2019/104602
§ 371 (c)(1),
(2) Date: Mar. 4, 2022

(87) PCT Pub. No.: WO2021/042345
PCT Pub. Date: Mar. 11, 2021

(65) Prior Publication Data
US 2022/0321079 A1  Oct. 6, 2022

(51) Int. Cl.
| H03H 3/02 | (2006.01) |
| H03H 9/02 | (2006.01) |
| H03H 9/17 | (2006.01) |

(52) U.S. Cl.
CPC .......... H03H 3/02 (2013.01); H03H 9/02031 (2013.01); H03H 9/173 (2013.01); H03H 9/176 (2013.01); H03H 2003/021 (2013.01)

(58) Field of Classification Search
CPC ...... H03H 3/02; H03H 9/02031; H03H 9/173; H03H 9/176; H03H 2003/021; Y10T 29/42; Y10T 29/49126; Y10T 29/49155
See application file for complete search history.

(56) References Cited

U.S. PATENT DOCUMENTS

| 8,330,556 B2 | 12/2012 | Miller et al. |
| 9,123,885 B2 * | 9/2015 | Iwamoto ............ H03H 9/02228 |

(Continued)

FOREIGN PATENT DOCUMENTS

| CN | 106489238 A | 3/2017 |
| CN | 107222181 A | 9/2017 |

(Continued)

OTHER PUBLICATIONS

European Patent Office, Extended European Search Report Issued in Application No. 19944191.6, May 10, 2023, Germany, 8 pages.

(Continued)

*Primary Examiner* — Donghai D Nguyen
(74) *Attorney, Agent, or Firm* — Kilpatrick Townsend & Stockton LLP

(57) ABSTRACT

A method for forming a bulk acoustic wave resonance device is provided, includes: forming a first stack, and said forming the first stack includes providing a first substrate; forming a piezoelectric layer on the first substrate; forming a first electrode layer on the piezoelectric layer; forming a cavity preprocessing layer on the piezoelectric layer, and a cavity is to be formed based on the cavity preprocessing layer, the cavity preprocessing layer at least covers a first end of the first electrode layer, and the cavity preprocessing layer is in contact with the piezoelectric layer, a first side of the first stack corresponds to a side of the first substrate, and a second side of the first stack corresponds to a side of the cavity preprocessing layer; forming a second stack, and said forming the second stack includes providing a second substrate; joining the first stack and the second stack, and the second stack is disposed at the second side; removing the first substrate, and the first side corresponds to a side of the piezoelectric layer; forming a second electrode layer at the (Continued)

first side, and the second electrode layer is in contact with the piezoelectric layer; and removing the second stack.

43 Claims, 11 Drawing Sheets

(56) References Cited

U.S. PATENT DOCUMENTS

| | | | |
|---|---|---|---|
| 10,355,659 B2* | 7/2019 | Kim | ........................ H03H 9/173 |
| 2012/0073099 A1 | 3/2012 | Iwamoto et al. | |
| 2017/0149405 A1* | 5/2017 | Kishimoto | ............. H03H 9/173 |

FOREIGN PATENT DOCUMENTS

| | | | |
|---|---|---|---|
| CN | 109150135 A | 1/2019 | |
| CN | 109831172 A | 5/2019 | |

OTHER PUBLICATIONS

The international search report mailed Jun. 4, 2020 in PCT Application No. PCT/CN2019/104602.

* cited by examiner

```
                                                    200
┌─────────────────────────────────────────────────────────────────────────┐
│ forming a first stack, wherein the forming the first stack includes:    │
│ providing a first substrate; forming a piezoelectric layer on the first │
│ substrate; forming a first electrode layer on the piezoelectric layer;  │
│ forming a cavity preprocessing layer on the piezoelectric layer,        │── S201
│ wherein a cavity is to be formed based on the cavity preprocessing      │
│ layer, the cavity preprocessing layer at least covers a first end of    │
│ the first electrode layer, and the cavity preprocessing layer is in     │
│ contact with the piezoelectric layer, a first side of the first stack   │
│ corresponds to a side of the first substrate, and a second side of the  │
│ first stack corresponds to a side of the cavity preprocessing layer,    │
│ that is, the first side is opposite to the second side                  │
└─────────────────────────────────────────────────────────────────────────┘
                                     │
                                     ▼
┌─────────────────────────────────────────────────────────────────────────┐
│ forming a second stack, said forming the second stack includes:         │── S203
│ providing a second substrate                                            │
└─────────────────────────────────────────────────────────────────────────┘
                                     │
                                     ▼
┌─────────────────────────────────────────────────────────────────────────┐
│ joining the first stack and the second stack, wherein the second stack  │── S205
│ is disposed at the second side                                          │
└─────────────────────────────────────────────────────────────────────────┘
                                     │
                                     ▼
┌─────────────────────────────────────────────────────────────────────────┐
│ removing the first substrate, wherein the first side corresponds to a   │── S207
│ side of the piezoelectric layer                                         │
└─────────────────────────────────────────────────────────────────────────┘
                                     │
                                     ▼
┌─────────────────────────────────────────────────────────────────────────┐
│ forming a second electrode layer at the first side, wherein the second  │── S209
│ electrode layer is in contact with the piezoelectric layer              │
└─────────────────────────────────────────────────────────────────────────┘
                                     │
                                     ▼
┌─────────────────────────────────────────────────────────────────────────┐
│ etching the cavity preprocessing layer for forming the cavity, wherein  │── S211
│ the first end is disposed in the cavity                                 │
└─────────────────────────────────────────────────────────────────────────┘
                                     │
                                     ▼
┌─────────────────────────────────────────────────────────────────────────┐
│                      removing the second stack                          │── S213
└─────────────────────────────────────────────────────────────────────────┘
```

FIG. 2

(i)          (ii)          (iii)

METHOD FOR FORMING BULK ACOUSTIC WAVE RESONANCE DEVICE

CROSS-REFERENCE TO RELATED APPLICATIONS

This application is the national phase of International Application No. PCT/CN2019/104602, filed on Sep. 5, 2019, the entire disclosure of which is incorporated herein by reference.

FIELD

The present disclosure generally relates to semiconductor technology field, and more particularly, to a method for forming bulk acoustic wave resonance device.

BACKGROUND

A Radio Frequency (RF) front-end chip of a wireless communication equipment includes power amplifiers, antenna switches, radio frequency filters, duplexers, multiplexers and low noise amplifiers. The radio frequency filters include Surface Acoustic Wave (SAW) filters, Bulk Acoustic Wave (BAW) filters, Micro-Electro-Mechanical System (MEMS) filters, Integrated Passive Devices (IPD) filters, and so on. As both SAW resonators and BAW resonators have high Quality factor values (Q value), the RF filter including a SAW resonator, namely a SAW filter, and that including a BAW resonator, namely a BAW filter, have low insertion loss and high out-of-band rejection, and thus become current mainstream RF filters used by wireless communication equipments such as mobile phones and base stations. The Q value is a quality factor value of a resonator, and is defined by a center frequency divided by a bandwidth of the resonator at 3 dB attenuation. An operation frequency of the SAW filter generally ranges from 0.4 GHz to 2.7 GHz, and an operation frequency of the BAW filter generally ranges from 0.7 GHz to 7 GHz.

Compared with a SAW resonator, a BAW resonator has better performance, but a manufacturing cost of the BAW resonator is higher than that of the SAW resonator due to more complicated process. However, as the wireless communication technology evolves gradually, more and more frequency bands are used. Meanwhile, with an application of frequency band superposition technologies such as a carrier aggregation, a mutual interference between wireless frequency bands becomes more and more serious. High-performance BAW technology can solve the mutual interference problem between frequency bands. With the advent of the 5G era, a wireless mobile network has adopted higher communication frequency bands. Currently, the BAW technology can handle the filtering problem at high frequency.

FIG. 1a schematically illustrates a BAW filter circuit which includes a ladder circuit includes BAW resonators, and f1, f2, f3, f4 represent 4 different frequencies respectively. Within each BAW resonator, alternating voltages with different polarities are supplied to metal electrodes at both sides of a piezoelectric layer of the resonator, an acoustic wave is generated by the piezoelectric layer under the alternating voltages with different polarities, and the acoustic wave within the resonator propagates along a direction perpendicular to the piezoelectric layer. In order to form a resonance, the acoustic waves need to be totally reflected on an upper surface of an upper metal electrode and a lower surface of a lower metal electrode to form standing acoustic waves. A condition for acoustic waves reflection is that an acoustic impedance of medium in contact with the upper surface of the upper metal electrode and the lower surface of the lower metal electrode is greatly different from an acoustic impedance of the metal electrodes.

A Film Bulk Acoustic Wave Resonator (FBAR) is a BAW resonator which can restrain acoustic wave energy inside the resonator. There is air or vacuum above a resonance region of the resonator, and a cavity is disposed below the resonance region of the resonator. There is a large difference of an acoustic impedance between air and a metal electrode, acoustic waves can be totally reflected on an upper surface of an upper metal electrode and a lower surface of a lower metal electrode to form standing waves.

FIG. 1b schematically illustrates across-sectional structure diagram of a FBAR 100. The FBAR 100 includes: a substrate 101, a cavity 103 disposed at the upper surface of the substrate 101; an electrode layer 105 disposed on the substrate 101 and the cavity 103; a piezoelectric layer 107 disposed on the substrate 101 and covers the electrode layer 105, the piezoelectric layer 107 includes a convex portion 107a; an electrode layer 109 disposed on the piezoelectric layer 107, the electrode layer 109 includes a convex portion 109a disposed on the convex portion 107a; and, a resonance region 111 (that is, an overlap region between the electrode layer 105 and the convex portion 109a) is disposed on the cavity 103 and the resonance region 111 not only overlaps with but also touches the substrate 101. The FBAR 100 is formed by stacking layers, that is, the electrode layer 105 is disposed on the substrate 101, the piezoelectric layer 107 is disposed on the electrode layer 105 and the substrate 101, and then the electrode layer 109 is disposed on the piezoelectric layer 107. However, due to a protrusion of the electrode layer 105 above the substrate 101, disposing the piezoelectric layer 107 on the electrode layer 105 and the substrate 101 directly may cause some crystal grains in the piezoelectric layer 107 (such as crystal grains at both side portions 115 of the convex portion 107a) to suffer from a significant change to their orientation, and to be not parallel to other crystal grains (such as crystal grains at middle portion 117 of the convex portion 107a), which may decrease electromechanical coupling factor and a Q value of the FBAR. In addition, the substrate 101 may cause electrical losses.

SUMMARY

Embodiments of the present disclosure can achieve a method for forming bulk acoustic wave resonance device, which may result in a piezoelectric layer includes crystal grains not suffering from a significant change to their orientation, thus is conducive to improve electromechanical coupling factor of a resonance device and a Q value of the resonance device. In addition, the method for forming the resonance device can eliminate electrical losses caused by a substrate.

In an embodiment of the present disclosure, a method for forming bulk acoustic wave resonance device is provided, the method includes: forming a first stack, and the forming the first stack includes providing a first substrate; forming a piezoelectric layer on the first substrate; forming a first electrode layer on the piezoelectric layer; forming a cavity preprocessing layer on the piezoelectric layer, and a cavity is to be formed based on the cavity preprocessing layer, the cavity preprocessing layer at least covers a first end of the first electrode layer, and the cavity preprocessing layer is in contact with the piezoelectric layer, a first side of the first stack corresponds to a side of the first substrate, and a second side of the first stack corresponds to a side of the cavity preprocessing layer; forming a second stack, and the forming the second stack includes providing a second substrate; joining the first stack and the second stack, and the second stack is disposed at the second side; removing the first substrate, and the first side corresponds to a side of the piezoelectric layer; forming a second electrode layer at the first side, and the second electrode layer is in contact with the piezoelectric layer; and removing the second stack.

It should be noted that the piezoelectric layer is disposed on the first substrate and the surface of the first substrate is flat, which results in the piezoelectric layer includes crystal grains not suffering from a significant change to their orientation, thus is conducive to improve electromechanical coupling factor of a resonance device and a Q value of the resonance device. In addition, removing the second substrate can eliminate electrical losses caused by the second substrate.

In some embodiments, the forming the cavity preprocessing layer includes: forming a sacrificial layer on the piezoelectric layer, and the sacrificial layer covers the first end. In some embodiments, the sacrificial layer is made of, but not limited to, at least one selected from a group consisting of: polymer, silicon dioxide, doped silicon dioxide and polysilicon. In some embodiments, the polymer includes, but is not limited to, at least one selected from a group consisting of: BenzoCycloButene (BCB), photosensitive epoxy resin photoresist (such as SU-8), and polyimide. It should be noted that the doped silicon dioxide is silicon dioxide doped with other elements.

In some embodiments, the forming the cavity preprocessing layer further includes: forming a first intermediate layer on the piezoelectric layer, the first intermediate layer at least covers the sacrificial layer, and the second side corresponds to a side of the first intermediate layer. In some embodiments, the first intermediate layer is made of, but not limited to, at least one selected from a group consisting of: polymer, and insulating dielectric. In some embodiments, the polymer includes, but is not limited to, at least one selected from a group consisting of: BenzoCycloButene (BCB), photosensitive epoxy resin photoresist (such as SU-8), and polyimide. In some embodiments, the insulating dielectric includes, but is not limited to, at least one selected from a group consisting of: aluminum nitride, silicon dioxide, silicon nitride and titanium oxide. In some embodiments, the first intermediate layer has a thickness ranging from, but is not limited to, 20 μm to 100 μm. In some embodiments, the first intermediate layer further covers a second end of the first electrode layer. It should be noted that an acoustic impedance of the first intermediate layer may be relatively smaller than that of the piezoelectric layer, and the first intermediate layer and the piezoelectric layer form an acoustic reflection structure to restrain a leakage of acoustic waves from the resonance region.

In some embodiments, the piezoelectric layer includes crystal grains, crystal grains include a first crystal grain and a second crystal grain, and the first crystal grain and the second crystal grain are any two crystal grains among crystal grains; and a first coordinate axis along a first direction corresponds to a height of the first crystal grain, and a second coordinate axis along a second direction corresponds to a height of the second crystal grain, and the first direction and the second direction are the same or opposite. It should be noted that the first direction and the second direction being the same refers to an included angle between a vector along the first direction and a vector along the second direction ranges from 0 degree to 5 degrees; and the first direction and the second direction being opposite refers to an included angle between the vector along the first direction and the vector along the second direction ranges from 175 degrees to 180 degrees.

In some embodiments, the first crystal grain corresponds to the first coordinate system, the first coordinate system includes the first coordinate axis and a third coordinate axis along a third direction; the second crystal grain corresponds to the second coordinate system, the second coordinate system includes the second coordinate axis and a fourth coordinate axis along a fourth direction.

In some embodiments, the first coordinate system also includes a fifth coordinate axis along a fifth direction, the second coordinate system also includes a sixth coordinate axis along a sixth direction. In some embodiments, the first direction and the second direction are the same or opposite, the third direction and the fourth direction are the same or opposite. It should be noted that the third direction and the fourth direction being the same refers to an included angle between a vector along the third direction and a vector along the fourth direction ranges from 0 degree to 5 degrees; and the third direction and the fourth direction being opposite refers to an included angle between the vector along the third direction and the vector along the fourth direction ranges from 175 degrees to 180 degrees.

In some embodiments, the piezoelectric layer is made of, but not limited to, at least one selected from a group consisting of: aluminum nitride, aluminum nitride alloy, gallium nitride, zinc oxide, lithium tantalate, lithium niobate, lead zirconatetitanate, and lead magnesium niobate-lead titanate.

In some embodiments, the piezoelectric layer includes crystal grains, and a Full Width at Half Maximum (FWHM) of a rocking curve of a crystal made of crystal grains is lower than 2.5 degrees. It should be noted that the rocking curve describes a magnitude of an angular divergence of a specific crystal plane (determined by a diffraction angle) in a sample and is represented by a plane coordinate system. In one embodiment, a horizontal axis represents an included angle between the crystal plane and the sample plane, a vertical axis represents a diffraction intensity of the crystal plane at a certain included angle. The rocking curve indicates a crystal quality, and the smaller the FWHM of the rocking curve is, the higher the crystal quality is. In addition, an FWHM indicates an interval between two points whose function values are equal to a half of a peak value of the function.

In some embodiments, the joining the first stack and the second stack includes: adhering the first intermediate layer to the second substrate. In some embodiments, the adhering the first intermediate layer to the second substrate includes: applying pressure to the first intermediate layer and the second substrate for adhering the first intermediate layer to the second substrate.

In some embodiments, the removing the second stack includes: polishing and removing the second substrate.

In some embodiments, the method further includes: removing the sacrificial layer for forming the cavity, and the first end is disposed in the cavity.

In some embodiments, the forming the second stack further includes: forming a second intermediate layer on the second substrate. In some embodiments, the second intermediate layer is made of, but not limited to, a chemical substance with low surface energy. In some embodiments, the chemical substance with low surface energy includes, but is not limited to, at least one selected from a group consisting of: 1H,1H,2H,2H-perfluoroheptadecane trimethoxysilane, polydimethylsiloxane, hydrocarbons, fluorocarbons, polyethylene, polypropylene, and polytetrafluoroethylene. In some embodiments, the joining the first stack and the second stack includes: adhering the cavity preprocessing layer to the second intermediate layer. In some embodiments, the adhering the cavity preprocessing layer to the second intermediate layer includes: applying pressure to the cavity preprocessing layer and the second intermediate layer for adhering the cavity preprocessing layer to the second intermediate layer. In some embodiments, the removing the second stack includes: separating the cavity preprocessing layer and the second intermediate layer, and removing the second intermediate layer and the second substrate. In some embodiments, the separating the cavity preprocessing layer and the second intermediate layer includes: heating the second intermediate layer to make the second intermediate layer lose its viscidity, to separate the cavity preprocessing layer and the second intermediate layer.

In some embodiments, the forming the second stack further includes: forming a second intermediate layer on the second substrate. In some embodiments, the second intermediate layer is made of a material including, but is not limited to, a chemical substance with low surface energy. In some embodiments, the chemical substance with low surface energy includes, but is not limited to, at least one selected from a group consisting of: 1H,1H,2H,2H-perfluoroheptadecane trimethoxysilane, polydimethylsiloxane, hydrocarbons, fluorocarbons, polyethylene, polypropylene, and polytetrafluoroethylene. In some embodiments, the joining the first stack and the second stack includes: adhering the first intermediate layer to the second intermediate layer. In some embodiments, the adhering the first intermediate layer to the second intermediate layer includes: applying pressure to the first intermediate layer and the second intermediate layer to adhere the first intermediate layer to the second intermediate layer. In some embodiments, the removing the second stack includes: separating the first intermediate layer and the second intermediate layer, and removing the second intermediate layer and the second substrate. In some embodiments, the separating the first intermediate layer and the second intermediate layer includes: heating the second intermediate layer to make the second intermediate layer lose its viscidity, to separate the first intermediate layer and the second intermediate layer.

In some embodiments, the forming the cavity preprocessing layer further includes: before forming the first intermediate layer, forming an etching shield layer on the piezoelectric layer, and the etching shield layer at least covers the sacrificial layer. In some embodiments, the etching shield layer is made of, but not limited to, at least one selected from a group consisting of: aluminum nitride, silicon carbide, diamond, silicon nitride, silicon dioxide, alumina, and titanium dioxide. In some embodiments, the etching shield layer has a thickness ranging from, but is not limited to 2 μm to 6 μm. It should be noted that, when forming the cavity by etch, the etching shield layer may serve to protect the first intermediate layer. In addition, the etching shield layer may serve to protect the resonance device from being corroded by water or oxygen.

In some embodiments, the forming the piezoelectric layer includes: forming a first sub-piezoelectric layer on the first substrate; forming a second sub-piezoelectric layer on the first sub-piezoelectric layer. In some embodiments, an FWHM of a rocking curve of the first sub-piezoelectric layer is higher than 1.7 degrees; an FWHM of a rocking curve of the second sub-piezoelectric layer is lower than 1.7 degrees.

In some embodiments, the method further includes: removing the first sub-piezoelectric layer after removing the first substrate, and the first side corresponds to a side of the second sub-piezoelectric layer. It should be noted that an FWHM of a rocking curve being lower than 1.7 degrees means a relatively high crystal quality, an FWHM of a rocking curve being higher than 1.7 degrees means a relatively low crystal quality. When removing the first substrate, a crystal quality of the piezoelectric layer may be affected. Therefore, using the above-mentioned piezoelectric layer including a two-layered structure, after removing the first substrate, the first sub-piezoelectric layer with relatively low quality is removed, and the second sub-piezoelectric layer with relatively high quality is retained, thus is conducive to for improving the electromechanical coupling factor of the resonance device and the Q value of the resonance device.

In some embodiments, the forming the first stack further includes: forming a lithographic mark before forming the piezoelectric layer. In some embodiments, the forming the lithographic mark includes: forming an opening at an end of the first substrate; and forming the lithographic mark in the opening. In some embodiments, the method further includes: after removing the first substrate, the lithographic mark is retained at the first side, and the lithographic mark is in contact with the piezoelectric layer.

In some embodiments, the method further includes: before forming the second electrode layer, forming a periphery structure at the first side, and the periphery structure is in contact with the piezoelectric layer. In some embodiments, the forming the second electrode layer includes: forming a second electrode layer at an inner side of the periphery structure. It should be noted that the periphery structure is disposed at an outer side of the periphery of the second electrode layer, and the disposed surrounding periphery of the second electrode layer may restrain a leakage of transverse waves, and the Q value of the resonance device can be improved. Furthermore, the periphery structure is disposed within the resonance region. In some embodiments, the periphery structure is a ring structure.

In some embodiments, the forming the periphery structure includes, but is not limited to: forming a metal periphery structure at the first side, and the metal periphery structure is in contact with the piezoelectric layer. In some embodiments, the forming the periphery structure further includes: etching an inner side of the metal periphery structure (or, an inner side of the periphery structure) to form a slope. In some embodiments, an etching angle for etching the inner side of the metal periphery structure is within a range from 1 degree to 89 degrees. It should be noted that the inner side of the periphery structure presents a slope, and an outer side is upright, which may increase an impedance of the periphery structure, thereby better restraining the leakage of transverse waves.

It should be noted that the lithographic mark can conduct a calibration, aligning the disposed periphery structure or the second electrode layer with respect to the lithographic mark can improve the accuracy.

BRIEF DESCRIPTION OF THE DRAWINGS

FIGS. 2a and 2b schematically illustrates a flowchart of a method 200 for forming a bulk acoustic wave resonance device according to an embodiment of the present disclosure;

FIG. 18 (ii) schematically illustrates a structure diagram of a tetragonal crystal grain; and FIG. 18 (iii) schematically illustrates a structure diagram of a cubic crystal grain.

DETAILED DESCRIPTION

Embodiments of present disclosure will be described clearly in detail in conjunction with accompanying drawings.

In following description, specific details are set forth in order to provide a thorough understanding of the present disclosure, but the present disclosure may be practiced otherwise than as specifically described herein, and therefore the present disclosure is not limited by the specific embodiments disclosed below.

Figure 1A:
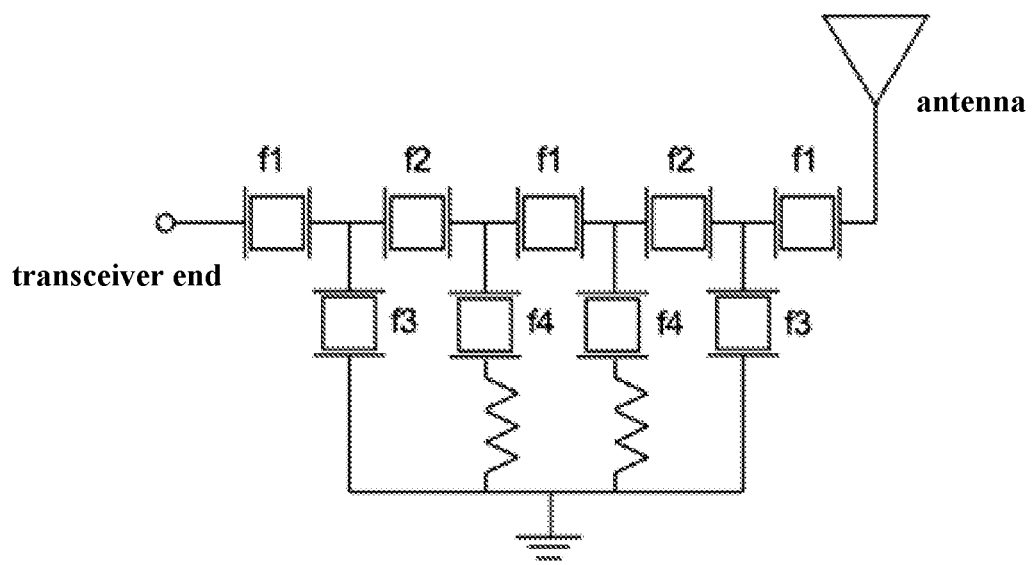
FIG. 1a schematically illustrates a diagram of a bulk acoustic wave resonance device circuit.
Figure 1B:
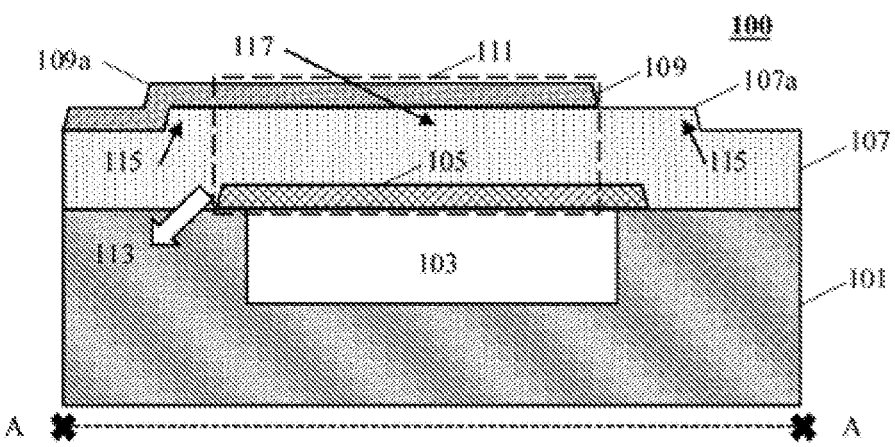
FIG. 1b schematically illustrates across-sectional structure diagram of a FBAR 100.

As mentioned in background, referring to FIG. 1b, the FBAR 100 is formed by stacking layers, that is, the electrode layer 105 is disposed on the substrate 101, the piezoelectric layer 107 is disposed on the electrode layer 105 and the substrate 101, and then the electrode layer 109 is disposed on the piezoelectric layer 107. However, due to a protrusion of the electrode layer 105 above the substrate 101, disposing the piezoelectric layer 107 on the electrode layer 105 and the substrate 101 directly may cause some crystal grains in the piezoelectric layer 107 (such as crystal grains at both side portions 115 of the convex portion 107a) to suffer from a significant change to their orientation, and are not parallel to other crystal grains (such as crystal grains at middle portion 117 of the convex portion 107a), which may decrease electromechanical coupling factor and a Q value of the FBAR. In addition, the substrate 101 may cause electrical losses.

Inventors of the present disclosure found that because a surface of a first substrate is flat, disposing a piezoelectric layer on the first substrate can make the piezoelectric layer includes crystal grains not suffering from a significant change to their orientation, thus is conducive to improve electromechanical coupling factor of a resonance device and a Q value of the resonance device.

Inventors of the present disclosure also found that removing a second substrate can eliminate electrical losses caused by the second substrate.

Further, since a lattice of the material of the first substrate and a lattice of a material of a piezoelectric layer do not match, the piezoelectric layer is divided into two sub-piezoelectric layers based on different crystal qualities. In one embodiment, the first sub-piezoelectric layer is a transition layer between the first substrate and the second sub-piezoelectric layer and has a relatively low crystal quality; and the second sub-piezoelectric layer is disposed on the first sub-piezoelectric layer and has a relatively high crystal quality. If the first sub-piezoelectric layer with relatively low crystal quality cannot be removed, the electromechanical coupling factor of the resonance device and the Q value of the resonance device may be affected. It should be noted that, referring to FIG. 1b, the FBAR 100 is disposed by stacking layers, the piezoelectric layer 107 is disposed on the electrode layer 105 directly, so the sub-piezoelectric layer with relatively low crystal quality in contact with the electrode layer 105 cannot be removed.

Inventors of the present disclosure further found that after removing the first substrate, the first sub-piezoelectric layer with relatively low crystal quality can be further removed, and the second sub-piezoelectric layer with relatively high crystal quality can be retained, thus is conducive to improve the electromechanical coupling factor of the resonance device and the Q value of the resonance device.

Inventors of the present disclosure further found that a lithographic mark on the piezoelectric layer can conduct a calibration, aligning a disposed periphery structure or a second electrode layer with respect to the lithographic mark can improve accuracy.

FIGS. 2a and 2b schematically illustrates a flowchart of a method 200 for forming a bulk acoustic wave resonance device according to an embodiment of the present disclosure As shown in FIGS. 2a and 2b, in an embodiment of the present disclosure, a method 200 for forming a bulk acoustic wave resonance device is provided; the method 200 includes S201, S203, S205, S207, S209, S211 and S213.

In S201, forming a first stack, and the forming the first stack includes: providing a first substrate; forming a piezoelectric layer on the first substrate; forming a first electrode layer on the piezoelectric layer; forming a cavity preprocessing layer on the piezoelectric layer, and a cavity is to be formed based on the cavity preprocessing layer, the cavity preprocessing layer at least covers a first end of the first electrode layer, and the cavity preprocessing layer is in contact with the piezoelectric layer, a first side of the first stack corresponds to a side of the first substrate, and a second side of the first stack corresponds to a side of the cavity preprocessing layer, that is, the first side is opposite to the second side.

In S203, forming a second stack, and the forming the second stack includes: providing a second substrate.

In S205, joining the first stack and the second stack, and the second stack is disposed at the second side.

In S207, removing the first substrate, and the first side corresponds to a side of the piezoelectric layer.

In S209, forming a second electrode layer at the first side, and the second electrode layer is in contact with the piezoelectric layer.

In S211, etching the cavity preprocessing layer for forming the cavity, and the first end is disposed in the cavity.

In S213, removing the second stack.

It should be noted that the piezoelectric layer is disposed on the first substrate and the surface of the first substrate is flat, which results in the piezoelectric layer includes crystal grains not suffering from a significant change to their orientation, thus is conducive to improve electromechanical coupling factor of the resonance device and a Q value of the resonance device. In addition, removing the second substrate can eliminate electrical losses caused by the second substrate.

In the embodiment, the first substrate is made of, but not limited to, at least one selected from a group consisting of: silicon, silicon carbide, and glass.

In the embodiment, the piezoelectric layer is made of, but not limited to, at least one selected from a group consisting of: aluminum nitride, aluminum nitride alloy, gallium nitride, zinc oxide, lithium tantalate, lithium niobate, lead zirconatetitanate, and lead magnesium niobate-lead titanate.

Figure 17:
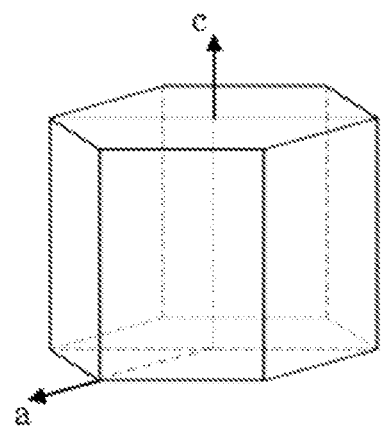
FIG. 17 schematically illustrates a structure diagram of a hexagonal crystal grain.
Figure 18:
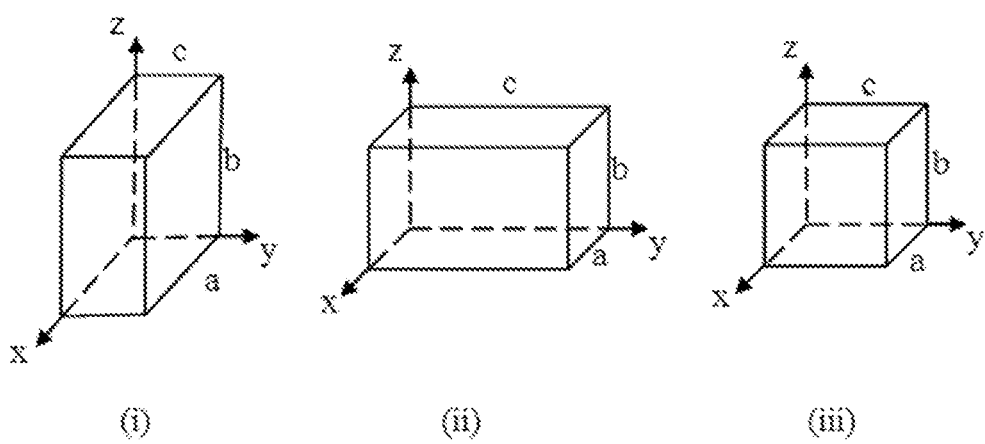
FIG. 18 (i) schematically illustrates a structure diagram of an orthorhombic crystal grain.

In the embodiment, the piezoelectric layer includes Crystal grains, and crystal grains include a first crystal grain and a second crystal grain, and the first crystal grain and the second crystal grain are any two crystal grains among crystal grains. In some embodiments, crystal orientation and crystal plane of a crystal grain can be represented based on a coordinate system. As shown in FIG. 17, a hexagonal crystal grain, such as an aluminum nitride crystal grain, can be represented by an ac three-dimensional coordinate system (including a-axis and c-axis). As shown in FIG. 18, crystal grains of (i) an orthorhombic system (a≠b≠c), (ii) a tetragonal system (a=b≠c), (iii) a cubic system (a=b=c), etc., can be represented by an xyz three-dimensional coordinate system (including x-axis, a y-axis and z-axis). In addition to these two examples, crystal grains can also be represented based on other coordinate systems, and therefore the present disclosure is not limited by the two embodiments described above.

According to the embodiment of the present disclosure, the first crystal grain may be represented based on a first three-dimensional coordinate system, and the second crystal grain may be represented based on a second three-dimensional coordinate system. The first three-dimensional coordinate system includes at least a first coordinate axis along a first direction and a third coordinate axis along a third direction, and the second three-dimensional coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In the embodiment of the present disclosure, the first direction and the second direction are the same or opposite. It should be noted that the first direction and the second direction being the same refers to an included angle between a vector along the first direction and a vector along the second direction ranges from 0 degree to 5 degrees; and the first direction and the second direction being opposite refers to an included angle between the vector along the first direction and the vector along the second direction ranges from 175 degrees to 180 degrees.

In another embodiment, the first three-dimensional coordinate system is an ac three-dimensional coordinate system, and the first coordinate axis is a first c-axis, and the third coordinate axis is a first a-axis. The second three-dimensional coordinate system is an ac three-dimensional coordinate system, and the second coordinate axis is a second c-axis, the fourth coordinate axis is a second a-axis, and the first c-axis and the second c-axis are in the same direction or in opposite direction.

In another embodiment, the first three-dimensional coordinate system further includes a fifth coordinate axis along a fifth direction, and the second three-dimensional coordinate system further includes a sixth coordinate axis along a sixth direction. In another embodiment, the first direction and the second direction are the same or opposite, and the third direction and the fourth direction are the same or opposite. It should be noted that the third direction and the fourth direction being the same refers to an included angle between a vector along the third direction and a vector along the fourth direction ranges from 0 degree to 5 degrees; and the third direction and the fourth direction being opposite refers to an included angle between the vector along the third direction and the vector along the fourth direction ranges from 175 degrees to 180 degrees.

In another embodiment, the first three-dimensional coordinate system is an xyz three-dimensional coordinate system, and the first coordinate axis is a first z-axis, the third coordinate axis is a first y-axis, and the fifth coordinate axis is a first x-axis. The second three-dimensional coordinate system is an xyz three-dimensional coordinate system, and the second coordinate axis is a second z-axis, the fourth coordinate axis is a second y-axis, and the sixth coordinate axis is a second x-axis. In another embodiment, the first z-axis and the second z-axis are in the same direction, and the first y-axis and the second y-axis are in the same direction. In another embodiment, the first z-axis and the second z-axis are in opposite direction, and the first y-axis and the second y-axis are in opposite direction. In another embodiment, the first z-axis and the second z-axis are in the same direction, and the first y-axis and the second y-axis are in opposite direction. In another embodiment, the first z-axis and the second z-axis are in opposite direction, and the first y-axis and the second y-axis are in the same direction.

In the embodiment, the piezoelectric layer includes crystal grains, and a Full Width at Half Maximum (FWHM) of a rocking curve of a crystal made of crystal grains is lower than 2.5 degrees. It should be noted that the rocking curve describes a magnitude of an angular divergence of a specific crystal plane (determined by a diffraction angle) in a sample and is represented by a plane coordinate system. In one embodiment, a horizontal axis represents an included angle between the crystal plane and the sample plane, a vertical axis represents a diffraction intensity of the crystal plane at a certain included angle. The rocking curve indicates a crystal quality, and the smaller the FWHM of the rocking curve is, the higher the crystal quality is. In addition, the FWHM indicates an interval between two points whose function values are equal to a half of a peak value of the function.

In the embodiment, the second substrate is made of, but not limited to, at least one selected from a group consisting of: silicon, silicon carbide, and glass.

In the embodiment, the S205 includes: adhering the cavity preprocessing layer to the second substrate. In another embodiment, the adhering the cavity preprocessing layer to the second substrate includes: applying pressure to the cavity preprocessing layer and the second substrate for adhering the cavity preprocessing layer to the second substrate.

In the embodiment, the first electrode layer and the second electrode layer are made of, but not limited to, at least one selected from a group consisting of: molybdenum, ruthenium, tungsten, platinum, iridium and aluminum.

In the embodiment, in S211, the etching method includes, but is not limited to, at least one selected from a group consisting of: oxygen ions etching, xenon difluoride etching and hydrofluoric acid etching.

In the embodiment, the S213 includes: polishing and removing the second substrate.

In an embodiment of the present disclosure, the method 200 for forming a bulk acoustic wave resonance device includes S201, S203, S205, S207, S209, S211 and S213.

In S201, forming a first stack, and the forming the first stack includes: providing a first substrate; forming a piezoelectric layer on the first substrate; forming a first electrode layer on the piezoelectric layer; forming a cavity preprocessing layer on the piezoelectric layer, and a cavity is to be formed based on the cavity preprocessing layer, the cavity preprocessing layer at least covers a first end of the first electrode layer, and the cavity preprocessing layer is in contact with the piezoelectric layer, a first side of the first stack corresponds to a side of the first substrate, and a second side of the first stack corresponds to a side of the cavity preprocessing layer, that is, the first side is opposite to the second side.

In S203, forming a second stack, and the forming the second stack includes: providing a second substrate.

In S205, joining the first stack and the second stack, and the second stack is disposed at the second side.

In S207, removing the first substrate, and the first side corresponds to a side of the piezoelectric layer.

In S209, forming a second electrode layer at the first side, and the second electrode layer is in contact with the piezoelectric layer.

In S211, etching the cavity preprocessing layer for forming the cavity, and the first end is disposed in the cavity.

In S213, removing the second stack.

Figure 3A:
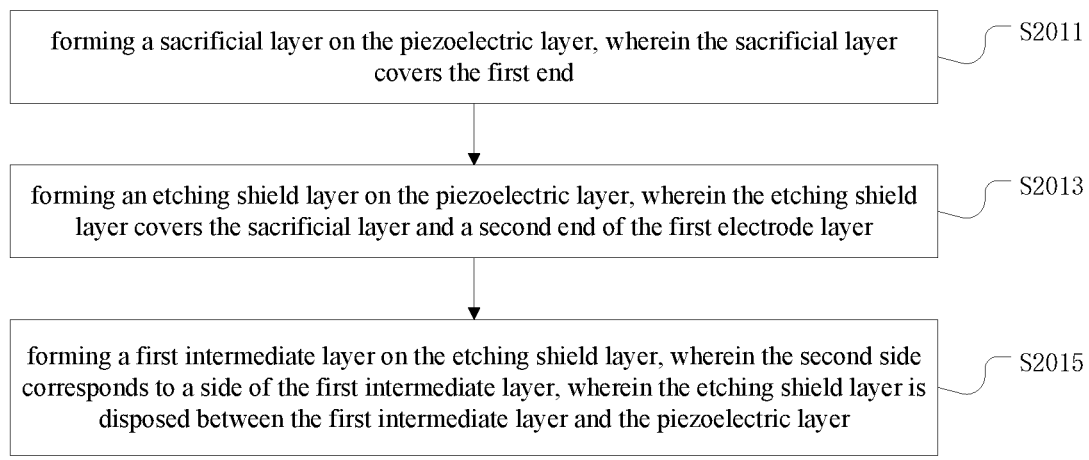
FIG. 3a schematically illustrates a flowchart of a method 300a for forming a cavity preprocessing layer according to the method 200 for forming a bulk acoustic wave resonance device according to an embodiment of the present disclosure.

In the embodiment, as shown in FIG. 3a, the forming a cavity preprocessing layer in S201 includes S2011, S2013 and S2015.

In S2011, forming a sacrificial layer on the piezoelectric layer, and the sacrificial layer covers the first end.

In S2013, forming an etching shield layer on the piezoelectric layer, and the etching shield layer covers the sacrificial layer and a second end of the first electrode layer.

In S2015, forming a first intermediate layer on the etching shield layer, and the second side corresponds to a side of the first intermediate layer, and the etching shield layer is disposed between the first intermediate layer and the piezoelectric layer.

In the embodiment, the sacrificial layer is made of, but not limited to, at least one selected from a group consisting of: polymer, silicon dioxide, doped silicon dioxide and polysilicon. In the embodiment, the polymer includes, but is not limited to, at least one selected from a group consisting of: BenzoCycloButene (BCB), photosensitive epoxy resin photoresist (such as SU-8), and polyimide. It should be noted that the doped silicon dioxide is silicon dioxide doped with other elements.

In the embodiment, the etching shield layer is made of, but not limited to, at least one selected from a group consisting of: aluminum nitride, silicon carbide, diamond, silicon nitride, silicon dioxide, alumina, and titanium dioxide. In the embodiment, the etching shield layer has a thickness ranging from, but is not limited to, 2 μm to 6 μm.

In the embodiment, the first intermediate layer is made of, but not limited to, at least one selected from a group consisting of: polymer, and insulating dielectric. In the embodiment, the polymer includes, but is not limited to, at least one selected from a group consisting of: BenzoCycloButene (BCB), photosensitive epoxy resin photoresist (such as SU-8), and polyimide. In the embodiment, the insulating dielectric includes, but is not limited to, at least one selected from a group consisting of: aluminum nitride, silicon dioxide, silicon nitride and titanium oxide. In some embodiments, the first intermediate layer has a thickness ranging from, but is not limited to, 20 μm to 100 μm. It should be noted that an acoustic impedance of the first intermediate layer may be relatively smaller than that of the piezoelectric layer, and the first intermediate layer and the piezoelectric layer form an acoustic reflection structure to restrain a leakage of acoustic waves from the resonance region.

In the embodiment, S205 includes: adhering the first intermediate layer to the second substrate. In another embodiment, the adhering the first intermediate layer to the second substrate includes: applying pressure to the first intermediate layer and the second substrate for adhering the first intermediate layer to the second substrate.

In the embodiment, S211 includes: etching and removing the sacrificial layer for forming the cavity, and the first end is disposed in the cavity. In the embodiment, the etching method includes, but is not limited to, at least one selected from a group consisting of: oxygen ions etching, xenon difluoride etching and hydrofluoric acid etching. It should be noted that, when forming the cavity by etch, the etching shield layer may serve to protect the first intermediate layer. In addition, the etching shield layer may serve to protect the resonance device from being corroded by water or oxygen.

In the embodiment, the S213 includes: polishing and removing the second substrate.

In an embodiment of the present disclosure, the method 200 for forming a bulk acoustic wave resonance device includes S201, S203, S205, S207, S209, S211 and S213.

In S201, forming a first stack, and the forming the first stack includes: providing a first substrate; forming a piezoelectric layer on the first substrate; forming a first electrode layer on the piezoelectric layer; forming a cavity preprocessing layer on the piezoelectric layer, and a cavity is to be formed based on the cavity preprocessing layer, the cavity preprocessing layer at least covers a first end of the first electrode layer, and the cavity preprocessing layer is in contact with the piezoelectric layer, a first side of the first stack corresponds to a side of the first substrate, and a second side of the first stack corresponds to a side of the cavity preprocessing layer, that is, the first side is opposite to the second side.

In S203, forming a second stack, and the forming the second stack includes: providing a second substrate.

In S205, joining the first stack and the second stack, and the second stack is disposed at the second side.

In S207, removing the first substrate, and the first side corresponds to a side of the piezoelectric layer.

In S209, forming a second electrode layer at the first side, and the second electrode layer is in contact with the piezoelectric layer.

In S211, etching the cavity preprocessing layer for forming the cavity, and the first end is disposed in the cavity.

In S213, removing the second stack.

Figure 3B:
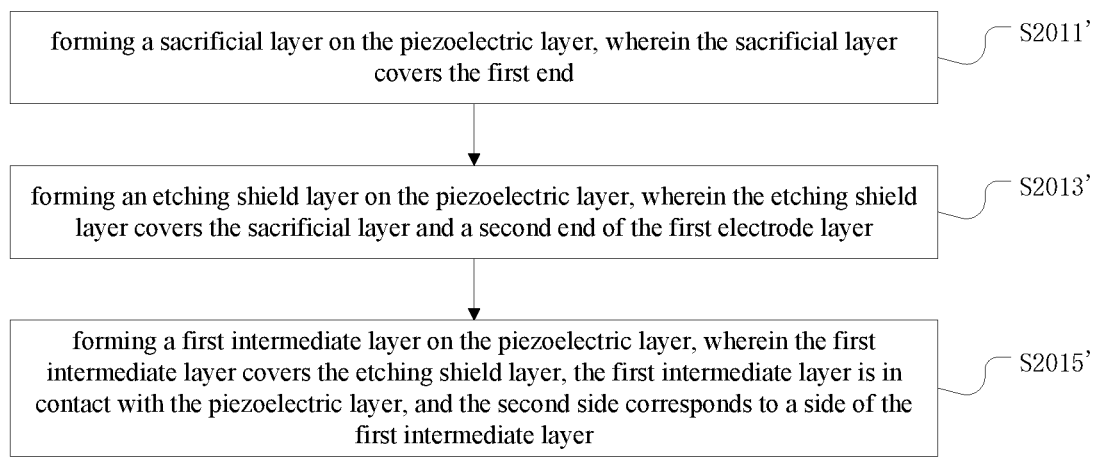
FIG. 3b schematically illustrates a flowchart of a method 300b for forming a cavity preprocessing layer according to the method 200 for forming a bulk acoustic wave resonance device according to an embodiment of the present disclosure.

In the embodiment, as shown in FIG. 3b, the forming the cavity preprocessing layer in S201 includes S2011', S2013' and S2015'.

In S2011', forming a sacrificial layer on the piezoelectric layer, and the sacrificial layer covers the first end.

In S2013', forming an etching shield layer on the piezoelectric layer, and the etching shield layer covers the sacrificial layer and a second end of the first electrode layer.

In S2015', forming a first intermediate layer on the piezoelectric layer, and the first intermediate layer covers the etching shield layer, the first intermediate layer is in contact with the piezoelectric layer, and the second side corresponds to a side of the first intermediate layer.

In the embodiment, the sacrificial layer is made of, but not limited to, at least one selected from a group consisting of: polymer, silicon dioxide, doped silicon dioxide and polysilicon. In the embodiment, the polymer includes, but is not limited to, at least one selected from a group consisting of: BenzoCycloButene (BCB), photosensitive epoxy resin photoresist (such as SU-8), and polyimide. It should be noted that the doped silicon dioxide is silicon dioxide doped with other elements.

In the embodiment, the etching shield layer is made of, but not limited to, at least one selected from a group consisting of: aluminum nitride, silicon carbide, diamond, silicon nitride, silicon dioxide, alumina, and titanium dioxide. In the embodiment, the etching shield layer has a thickness ranging from, but is not limited to, 2 μm to 6 μm.

In the embodiment, the first intermediate layer is made of, but not limited to, at least one selected from a group consisting of: polymer, and insulating dielectric. In the embodiment, the polymer includes, but is not limited to, at least one selected from a group consisting of: BenzoCycloButene (BCB), photosensitive epoxy resin photoresist (such as SU-8), and polyimide. In the embodiment, the insulating dielectric includes, but is not limited to, at least one selected from a group consisting of: aluminum nitride, silicon dioxide, silicon nitride and titanium oxide. In some embodiments, the first intermediate layer has a thickness ranging from, but is not limited to, 20 μm to 100 μm. It should be noted that an acoustic impedance of the first intermediate layer may be relatively smaller than that of the piezoelectric layer, and the first intermediate layer and the piezoelectric layer form an acoustic reflection structure to restrain a leakage of acoustic waves from the resonance region.

In the embodiment, S205 includes: adhering the first intermediate layer to the second substrate. In another embodiment, the adhering the first intermediate layer to second substrate includes: applying pressure to the first intermediate layer and the second substrate for adhering the first intermediate layer to the second substrate.

In the embodiment, S211 includes: etching and removing the sacrificial layer for forming the cavity, and the first end is disposed in the cavity. In the embodiment, the etching method includes, but is not limited to, at least one selected from a group consisting of: oxygen ions etching, xenon difluoride etching and hydrofluoric acid etching. It should be noted that, when forming the cavity by etch, the etching shield layer may serve to protect the first intermediate layer. In addition, the etching shield layer may serve to protect the resonance device from being corroded by water or oxygen.

In the embodiment, the S213 includes: polishing and removing the second substrate.

In an embodiment of the present disclosure, the method 200 for forming a bulk acoustic wave resonance device includes S201, S203, S205, S207, S209, S211 and S213.

In S201, forming a first stack, and the forming the first stack includes: providing a first substrate; forming a piezoelectric layer on the first substrate; forming a first electrode layer on the piezoelectric layer; forming a cavity preprocessing layer on the piezoelectric layer, and a cavity is to be formed based on the cavity preprocessing layer, the cavity preprocessing layer at least covers a first end of the first electrode layer, and the cavity preprocessing layer is in contact with the piezoelectric layer, a first side of the first stack corresponds to a side of the first substrate, and a second side of the first stack corresponds to a side of the cavity preprocessing layer, that is, the first side is opposite to the second side.

In S203, forming a second stack, and the forming the second stack includes: providing a second substrate.

In S205, joining the first stack and the second stack, and the second stack is disposed at the second side.

In S207, removing the first substrate, and the first side corresponds to a side of the piezoelectric layer.

In S209, forming a second electrode layer at the first side, and the second electrode layer is in contact with the piezoelectric layer.

In S211, etching the cavity preprocessing layer for forming the cavity, and the first end is disposed in the cavity.

In S213, removing the second stack.

Figure 3C:
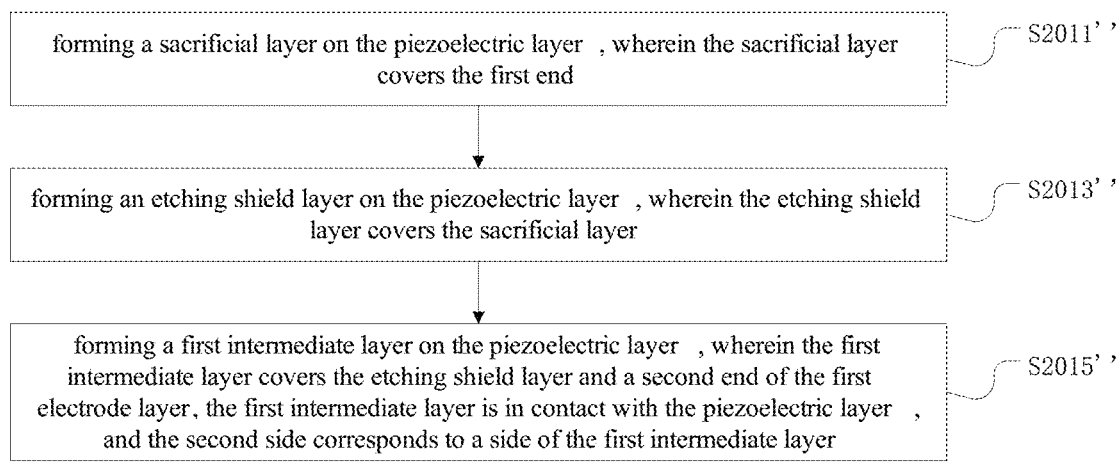
FIG. 3c schematically illustrates a flowchart of a method 300c for forming a cavity preprocessing layer according to the method 200 for forming a bulk acoustic wave resonance device according to an embodiment of the present disclosure.

In the embodiment, as shown in FIG. 3c, the forming the cavity preprocessing layer in S201 includes S2011", S2013" and S2015".

In S2011", forming a sacrificial layer on the piezoelectric layer, and the sacrificial layer covers the first end.

In S2013", forming an etching shield layer on the piezoelectric layer, and the etching shield layer covers the sacrificial layer.

In S2015", forming a first intermediate layer on the piezoelectric layer, and the first intermediate layer covers the etching shield layer and a second end of the first electrode layer, the first intermediate layer is in contact with the piezoelectric layer, and the second side corresponds to a side of the first intermediate layer.

In the embodiment, the sacrificial layer is made of, but not limited to, at least one selected from a group consisting of: polymer, silicon dioxide, doped silicon dioxide and polysilicon. In the embodiment, the polymer includes, but is not limited to, at least one selected from a group consisting of: BenzoCycloButene (BCB), photosensitive epoxy resin photoresist (such as SU-8), and polyimide. It should be noted that the doped silicon dioxide is silicon dioxide doped with other elements.

In the embodiment, the etching shield layer is made of, but not limited to, at least one selected from a group consisting of: aluminum nitride, silicon carbide, diamond, silicon nitride, silicon dioxide, alumina, and titanium dioxide. In the embodiment, the etching shield layer has a thickness ranging from, but is not limited to, 2 μm to 6 μm.

In the embodiment, the first intermediate layer is made of, but not limited to, at least one selected from a group consisting of: polymer, and insulating dielectric. In the embodiment, the polymer includes, but is not limited to, at least one selected from a group consisting of: BenzoCycloButene (BCB), photosensitive epoxy resin photoresist (such as SU-8), and polyimide. In the embodiment, the insulating dielectric includes, but is not limited to, at least one selected from a group consisting of: aluminum nitride, silicon dioxide, silicon nitride and titanium oxide. In some embodiments, the first intermediate layer has a thickness ranging from, but is not limited to, 20 μm to 100 μm. It should be noted that an acoustic impedance of the first intermediate layer may be relatively smaller than that of the piezoelectric layer, and the first intermediate layer and the piezoelectric layer form an acoustic reflection structure to restrain a leakage of acoustic waves from the resonance region.

In the embodiment, S205 includes: adhering the first intermediate layer to the second substrate. In another embodiment, the adhering the first intermediate layer to the second substrate includes: applying pressure to the first intermediate layer and the second substrate for adhering the first intermediate layer to the second substrate.

In the embodiment, S211 includes: etching and removing the sacrificial layer for forming the cavity, and the first end is disposed in the cavity. In the embodiment, the etching method includes, but is not limited to, at least one selected from a group consisting of: oxygen ions etching, xenon difluoride etching and hydrofluoric acid etching. It should be noted that, when forming the cavity by etch, the etching shield layer may serve to protect the first intermediate layer. In addition, the etching shield layer may serve to protect the resonance device from being corroded by water or oxygen.

In the embodiment, the S213 includes: polishing and removing the second substrate.

In an embodiment of the present disclosure, the method 200 for forming a bulk acoustic wave resonance device includes S201, S203, S205, S207, S209, S211 and S213.

In S201, forming a first stack, and the forming the first stack includes: providing a first substrate; forming a piezoelectric layer on the first substrate; forming a first electrode layer on the piezoelectric layer; forming a cavity preprocessing layer on the piezoelectric layer, and a cavity is to be formed based on the cavity preprocessing layer, the cavity preprocessing layer at least covers a first end of the first electrode layer, and the cavity preprocessing layer is in contact with the piezoelectric layer, a first side of the first stack corresponds to a side of the first substrate, and a second side of the first stack corresponds to a side of the cavity preprocessing layer, that is, the first side is opposite to the second side.

In S203, forming a second stack, and the forming the second stack includes: providing a second substrate.

In S205, joining the first stack and the second stack, and the second stack is disposed at the second side.

In S207, removing the first substrate, and the first side corresponds to a side of the piezoelectric layer.

In S209, forming a second electrode layer at the first side, and the second electrode layer is in contact with the piezoelectric layer.

In S211, etching the cavity preprocessing layer for forming the cavity, and the first end is disposed in the cavity.

In S213, removing the second stack.

In the embodiment, S203 further includes: forming a second intermediate layer on the second substrate.

In the embodiment, the second intermediate layer is made of, but not limited to, a chemical substance with low surface energy. In the embodiment, the chemical substance with low surface energy includes, but is not limited to, at least one selected from a group consisting of: 1H,1H,2H,2H-perfluoroheptadecane trimethoxysilane, polydimethylsiloxane, hydrocarbons, fluorocarbons, polyethylene, polypropylene, and polytetrafluoroethylene.

In the embodiment, S205 includes: adhering the cavity preprocessing layer to the second intermediate layer. In another embodiment, the adhering the cavity preprocessing layer to the second intermediate layer includes: applying pressure to the cavity preprocessing layer and the second intermediate layer for adhering the cavity preprocessing layer to the second intermediate layer.

In the embodiment, S213 includes: separating the cavity preprocessing layer and the second intermediate layer to remove the second stack. In another embodiment, the separating the cavity preprocessing layer and the second intermediate layer includes: heating the second intermediate layer to make the second intermediate layer lose its viscidity, to separate the cavity preprocessing layer and the second intermediate layer.

It should be noted that using the second intermediate layer with low surface energy material helps to facilitate the removal of the second substrate, and can better protect the second substrate to be recyclable, which reduces fabrication costs.

In an embodiment of the present disclosure, the method 200 for forming a bulk acoustic wave resonance device includes S201, S203, S205, S207, S209, S211 and S213.

In S201, forming a first stack, and the forming the first stack includes: providing a first substrate; forming a piezoelectric layer on the first substrate; forming a first electrode layer on the piezoelectric layer; forming a cavity preprocessing layer on the piezoelectric layer, and a cavity is to be formed based on the cavity preprocessing layer, the cavity preprocessing layer at least covers a first end of the first electrode layer, and the cavity preprocessing layer is in contact with the piezoelectric layer, a first side of the first stack corresponds to a side of the first substrate, and a second side of the first stack corresponds to a side of the cavity preprocessing layer, that is, the first side is opposite to the second side.

In S203, forming a second stack, and the forming the second stack includes: providing a second substrate.

In S205, joining the first stack and the second stack, and the second stack is disposed at the second side.

In S207, removing the first substrate, and the first side corresponds to a side of the piezoelectric layer.

In S209, forming a second electrode layer at the first side, and the second electrode layer is in contact with the piezoelectric layer.

In S211, etching the cavity preprocessing layer for forming the cavity, and the first end is disposed in the cavity.

In S213, removing the second stack.

In the embodiment, the forming the cavity preprocessing layer in S201 includes the following steps.

Forming a sacrificial layer on the piezoelectric layer, and the sacrificial layer covers the first end.

Forming a first intermediate layer on the piezoelectric layer, and the first intermediate layer covers the etching shield layer and a second end of the first electrode layer, the first intermediate layer is in contact with the piezoelectric layer, and the second side corresponds to a side of the first intermediate layer.

In the embodiment, the sacrificial layer is made of, but not limited to, at least one selected from a group consisting of: polymer, silicon dioxide, doped silicon dioxide and polysilicon. In the embodiment, the polymer includes, but is not limited to, at least one selected from a group consisting of: BenzoCycloButene (BCB), photosensitive epoxy resin photoresist (such as SU-8), and polyimide. It should be noted that the doped silicon dioxide is silicon dioxide doped with other elements.

In the embodiment, the first intermediate layer is made of, but not limited to, at least one selected from a group consisting of: polymer, and insulating dielectric. In the embodiment, the polymer includes, but is not limited to, at least one selected from a group consisting of: BenzoCycloButene (BCB), photosensitive epoxy resin photoresist (such as SU-8), and polyimide. In the embodiment, the insulating dielectric includes, but is not limited to, at least one selected from a group consisting of: aluminum nitride, silicon dioxide, silicon nitride and titanium oxide. In some embodiments, the first intermediate layer has a thickness ranging from, but is not limited to, 20 μm to 100 μm. It should be noted that an acoustic impedance of the first intermediate layer may be relatively smaller than that of the piezoelectric layer, and the first intermediate layer and the piezoelectric layer form an acoustic reflection structure to restrain a leakage of acoustic waves from the resonance region.

In the embodiment, S203 further includes: forming a second intermediate layer on the second substrate.

In the embodiment, the second intermediate layer is made of, but not limited to, a chemical substance with low surface energy. In the embodiment, the chemical substance with low surface energy includes, but is not limited to, at least one selected from a group consisting of: 1H,1H,2H,2H-perfluoroheptadecane trimethoxysilane, polydimethylsiloxane, hydrocarbons, fluorocarbons, polyethylene, polypropylene, and polytetrafluoroethylene.

In the embodiment, S205 includes: adhering the first intermediate layer to the second intermediate layer. In another embodiment, the adhering the first intermediate layer to the second intermediate layer includes: applying pressure to the first intermediate layer and the second intermediate layer for adhering the first intermediate layer to the second intermediate layer.

In the embodiment, S211 includes: etching and removing the sacrificial layer for forming the cavity, and the first end is disposed in the cavity. In the embodiment, the etching method includes, but is not limited to, at least one selected from a group consisting of: oxygen ions etching, xenon difluoride etching and hydrofluoric acid etching.

In the embodiment, S213 includes: separating the first intermediate layer and the second intermediate layer to remove the second stack. In another embodiment, the separating the first intermediate layer and the second intermediate layer includes: heating the second intermediate layer to make the second intermediate layer lose its viscidity, to separate the first intermediate layer and the second intermediate layer.

It should be noted that using the second intermediate layer with a low surface energy material helps to facilitate the removal of the second substrate, and can better protect the second substrate to be recyclable, which reduces fabrication costs.

In an embodiment of the present disclosure, the method 200 for forming a bulk acoustic wave resonance device includes S201, S203, S205, S207, S209, S211 and S213.

In S201, forming a first stack, and the forming the first stack includes: providing a first substrate; forming a piezoelectric layer on the first substrate; forming a first electrode layer on the piezoelectric layer; forming a cavity preprocessing layer on the piezoelectric layer, and a cavity is to be formed based on the cavity preprocessing layer, the cavity preprocessing layer at least covers a first end of the first electrode layer, and the cavity preprocessing layer is in contact with the piezoelectric layer, a first side of the first stack corresponds to a side of the first substrate, and a second side of the first stack corresponds to a side of the cavity preprocessing layer, that is, the first side is opposite to the second side.

In S203, forming a second stack, and the forming the second stack includes: providing a second substrate.

In S205, joining the first stack and the second stack, and the second stack is disposed at the second side.

In S207, removing the first substrate, and the first side corresponds to a side of the piezoelectric layer.

In S209, forming a second electrode layer at the first side, and the second electrode layer is in contact with the piezoelectric layer.

In S211, etching the cavity preprocessing layer for forming the cavity, and the first end is disposed in the cavity.

In S213, removing the second stack.

In the embodiment, the forming the piezoelectric layer in S201 includes: forming a first sub-piezoelectric layer on the first substrate; and forming a second sub-piezoelectric layer on the first sub-piezoelectric layer.

In the embodiment, an FWHM of a rocking curve of the first sub-piezoelectric layer is higher than 1.7 degrees; an FWHM of a rocking curve of the second sub-piezoelectric layer is lower than 1.7 degrees. It should be noted that the rocking curve describes a magnitude of an angular divergence of a specific crystal plane (determined by a diffraction angle) in a sample and is represented by a plane coordinate system. In one embodiment, a horizontal axis represents an included angle between the crystal plane and the sample plane, a vertical axis represents a diffraction intensity of the crystal plane at a certain included angle. The rocking curve indicates a crystal quality, and the smaller the FWHM of the rocking curve is, the higher the crystal quality is (that is, an FWHM of a rocking curve being lower than 1.7 degrees means a relatively high crystal quality, an FWHM of a rocking curve being higher than 1.7 degrees means a relatively low crystal quality). In addition, an FWHM indicates an interval between two points whose function values are equal to a half of a peak value of the function.

In the embodiment, the first sub-piezoelectric layer is made of, but not limited to, at least one selected from a group consisting of: aluminum nitride, aluminum nitride alloy, gallium nitride, zinc oxide, lithium tantalate, lithium niobate, lead zirconatetitanate, and lead magnesium niobate-lead titanate. In the embodiment, the second sub-piezoelectric layer is made of, but not limited to, at least one selected from a group consisting of: aluminum nitride, aluminum nitride alloy, gallium nitride, zinc oxide, lithium tantalate, lithium niobate, lead zirconatetitanate, and lead magnesium niobate-lead titanate. In the embodiment, the first sub-piezoelectric layer is made of the same material as the second sub-piezoelectric layer. In another embodiment, the first sub-piezoelectric layer may be made of a material different from that of the second sub-piezoelectric layer.

In the embodiment, the second sub-piezoelectric layer includes crystal grains, and crystal grains include a first crystal grain and a second crystal grain, and the first crystal grain and the second crystal grain are any two crystal grains among crystal grains. In some embodiments, crystal orientation and crystal plane of a crystal grain can be represented based on a coordinate system. As shown in FIG. 17, a hexagonal crystal grain, such as an aluminum nitride crystal grain, can be represented by an ac three-dimensional coordinate system (including a-axis and c-axis). As shown in FIG. 18, crystal grains of (i) an orthorhombic system ($a \neq b \neq c$), (ii) a tetragonal system ($a=b \neq c$), (iii) a cubic system ($a=b=c$), etc., can be represented by an xyz three-dimensional coordinate system (including x-axis, y-axis and z-axis). In addition to these two examples, crystal grains can also be represented based on other coordinate systems, and therefore the present disclosure is not limited by the two embodiments described above.

According to the embodiment, the first crystal grain may be represented based on a first three-dimensional coordinate system, and the second crystal grain may be represented based on a second three-dimensional coordinate system. The first three-dimensional coordinate system includes at least a first coordinate axis along a first direction and a third coordinate axis along a third direction, and the second three-dimensional coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In the embodiment of the present disclosure, the first direction and the second direction are the same or opposite. It should be noted that the first direction and the second direction being the same refers to an included angle between a vector along the first direction and a vector along the second direction ranges from 0 degree to 5 degrees; and the first direction and the second direction being opposite refers to an included angle between the vector along the first direction and the vector along the second direction ranges from 175 degrees to 180 degrees.

In another embodiment, the first three-dimensional coordinate system is an ac three-dimensional coordinate system, and the first coordinate axis is a first c-axis, and the third coordinate axis is a first a-axis. The second three-dimensional coordinate system is an ac three-dimensional coordinate system, and the second coordinate axis is a second c-axis, the fourth coordinate axis is a second a-axis, and the first c-axis and the second c-axis are in the same direction or in opposite direction.

In another embodiment, the first three-dimensional coordinate system further includes a fifth coordinate axis along a fifth direction, and the second three-dimensional coordinate system further includes a sixth coordinate axis along a sixth direction. In another embodiment, the first direction and the second direction are the same or opposite, the third direction and the fourth direction are the same or opposite. It should be noted that the third direction and the fourth direction being the same refers to an included angle between a vector along the third direction and a vector along the fourth direction ranges from 0 degree to 5 degrees; and the third direction and the fourth direction being opposite refers to an included angle between the vector along the third direction and the vector along the fourth direction ranges from 175 degrees to 180 degrees.

In another embodiment, the first three-dimensional coordinate system is an xyz three-dimensional coordinate system, and the first coordinate axis is a first z-axis, the third coordinate axis is a first y-axis, and the fifth coordinate axis is a first x-axis. The second three-dimensional coordinate system is an xyz three-dimensional coordinate system, and the second coordinate axis is a second z-axis, the fourth coordinate axis is a second y-axis, and the sixth coordinate axis is a second x-axis. In another embodiment, the first z-axis and the second z-axis are in the same direction, and the first y-axis and the second y-axis are in the same direction. In another embodiment, the first z-axis and the second z-axis are in opposite direction, and the first y-axis and the second y-axis are in opposite direction. In another embodiment, the first z-axis and the second z-axis are in the same direction, and the first y-axis and the second y-axis are in opposite direction. In another embodiment, the first z-axis and the second z-axis are in opposite direction, and the first y-axis and the second y-axis are in the same direction.

In the embodiment, the method 200 for forming a bulk acoustic wave resonance device further includes: removing the first sub-piezoelectric layer after S207, and the first side corresponds to a side of the second sub-piezoelectric layer.

In the embodiment, S209 includes: forming a second electrode layer in contact with the second sub-piezoelectric layer.

It should be noted that since a lattice of the material of the first substrate and a lattice of a material of a piezoelectric layer do not match, the piezoelectric layer is divided into two sub-piezoelectric layers based on different crystal qualities. In one embodiment, the first sub-piezoelectric layer is a transition layer between the first substrate and the second sub-piezoelectric layer and has a relatively low crystal quality; and the second sub-piezoelectric layer is disposed on the first sub-piezoelectric layer and has a relatively high crystal quality. In the embodiment, after removing the first substrate, the first sub-piezoelectric layer with relatively low crystal quality can be further removed, and the second sub-piezoelectric layer with relatively high crystal quality can be retained, thus is conducive to improve the electromechanical coupling factor of the resonance device and the Q value of the resonance device.

In an embodiment of the present disclosure, the method 200 for forming a bulk acoustic wave resonance device includes S201, S203, S205, S207, S209, S211 and S213.

In S201, forming a first stack, and the forming the first stack includes: providing a first substrate; forming a piezoelectric layer on the first substrate; forming a first electrode layer on the piezoelectric layer; forming a cavity preprocessing layer on the piezoelectric layer, and a cavity is to be formed based on the cavity preprocessing layer, the cavity preprocessing layer at least covers a first end of the first electrode layer, and the cavity preprocessing layer is in contact with the piezoelectric layer, a first side of the first stack corresponds to a side of the first substrate, and a second side of the first stack corresponds to a side of the cavity preprocessing layer, that is, the first side is opposite to the second side.

In S203, forming a second stack, and the forming the second stack includes: providing a second substrate.

In S205, joining the first stack and the second stack, and the second stack is disposed at the second side.

In S207, removing the first substrate, and the first side corresponds to a side of the piezoelectric layer.

In S209, forming a second electrode layer at the first side, and the second electrode layer is in contact with the piezoelectric layer.

In S211, etching the cavity preprocessing layer for forming the cavity, and the first end is disposed in the cavity.

In S213, removing the second stack.

In the embodiment, S201 further includes: forming a lithographic mark before forming the piezoelectric layer. In the embodiment, the forming the lithographic mark includes: forming an opening at an end of the first substrate; and forming the lithographic mark in the opening.

In the embodiment, the lithographic mark is made of, but not limited to, at least one selected from a group consisting of: aluminum nitride, aluminum nitride alloy, gallium nitride, zinc oxide, lithium tantalate, lithium niobate, lead zirconatetitanate, and lead magnesium niobate-lead titanate. In the embodiment, the piezoelectric layer is made of, but not limited to, at least one selected from a group consisting of: aluminum nitride, aluminum nitride alloy, gallium nitride, zinc oxide, lithium tantalate, lithium niobate, lead zirconatetitanate, and lead magnesium niobate-lead titanate. In the embodiment, the lithographic mark is made of the same material as the piezoelectric layer. In another embodiment, the lithographic mark is made of a material different from the material of the piezoelectric layer.

In the embodiment, S207 further includes: retaining the lithographic mark at an end of the piezoelectric layer, and the lithographic mark is disposed at the first side, and the lithographic mark is in contact with the piezoelectric layer.

In the embodiment, S209 includes: forming the second electrode layer based on the lithographic mark.

It should be noted that the lithographic mark can conduct a calibration, aligning the disposed second electrode layer with respect to the lithographic mark, and thus can improve the accuracy.

In an embodiment of the present disclosure, the method 200 for forming a bulk acoustic wave resonance device includes S201, S203, S205, S207, S209, S211 and S213.

In S201, forming a first stack, and the forming the first stack includes: providing a first substrate; forming a piezoelectric layer on the first substrate; forming a first electrode layer on the piezoelectric layer; forming a cavity preprocessing layer on the piezoelectric layer, and a cavity is to be formed based on the cavity preprocessing layer, the cavity preprocessing layer at least covers a first end of the first electrode layer, a first side of the first stack corresponds to a side of the first substrate, and a second side of the first stack corresponds to a side of the cavity preprocessing layer, that is, the first side is opposite to the second side.

In S203, forming a second stack, and the forming the second stack includes: providing a second substrate.

In S205, joining the first stack and the second stack, and the second stack is disposed at the second side.

In S207, removing the first substrate, and the first side corresponds to a side of the piezoelectric layer.

In S209, forming a second electrode layer at the first side, and the second electrode layer is in contact with the piezoelectric layer.

In S211, etching the cavity preprocessing layer for forming the cavity, and the first end is disposed in the cavity.

In S213, removing the second stack.

In the embodiment, S201 further includes: forming a lithographic mark before forming the piezoelectric layer. In the embodiment, the forming the lithographic mark includes: forming an opening at an end of the first substrate; and forming the lithographic mark in the opening.

In the embodiment, the lithographic mark is made of, but not limited to, at least one selected from a group consisting of: aluminum nitride, aluminum nitride alloy, gallium nitride, zinc oxide, lithium tantalate, lithium niobate, lead zirconatetitanate, and lead magnesium niobate-lead titanate.

In the embodiment, the forming the piezoelectric layer in S201 includes: forming a first sub-piezoelectric layer on the first substrate and the lithographic mark; and forming a second sub-piezoelectric layer on the first sub-piezoelectric layer.

In the embodiment, an FWHM of a rocking curve of the first sub-piezoelectric layer is higher than 1.7 degrees; an FWHM of a rocking curve of the second sub-piezoelectric layer is lower than 1.7 degrees. It should be noted that the rocking curve describes a magnitude of an angular divergence of a specific crystal plane (determined by a diffraction angle) in a sample and is represented by a plane coordinate system. In one embodiment, a horizontal axis represents an included angle between the crystal plane and the sample plane, a vertical axis represents a diffraction intensity of the crystal plane at a certain included angle. The rocking curve indicates a crystal quality, and the smaller the FWHM of the rocking curve is, the higher the crystal quality is (that is, an FWHM of a rocking curve being lower than 1.7 degrees means a relatively high crystal quality, an FWHM of a rocking curve being higher than 1.7 degrees means a relatively low crystal quality). In addition, an FWHM indicates an interval between two points whose function values are equal to a half of a peak value of the function.

In the embodiment, the first sub-piezoelectric layer is made of, but not limited to, at least one selected from a group consisting of: aluminum nitride, aluminum nitride alloy, gallium nitride, zinc oxide, lithium tantalate, lithium niobate, lead zirconatetitanate, and lead magnesium niobate-lead titanate. In the embodiment, the second sub-piezoelectric layer is made of, but not limited to, at least one selected from a group consisting of: aluminum nitride, aluminum nitride alloy, gallium nitride, zinc oxide, lithium tantalate, lithium niobate, lead zirconatetitanate, and lead magnesium niobate-lead titanate.

In the embodiment, the first sub-piezoelectric layer is made of the same material as the second sub-piezoelectric layer. In another embodiment, the first sub-piezoelectric layer may be made of a material different from that of the second sub-piezoelectric layer. In the embodiment, the lithographic mark is made of the same material as the first sub-piezoelectric layer. In another embodiment, the lithographic mark may be made of a material different from that of the first sub-piezoelectric layer.

In the embodiment, the second sub-piezoelectric layer includes crystal grains, and crystal grains include a first crystal grain and a second crystal grain, and the first crystal grain and the second crystal grain are any two crystal grains among crystal grains. In some embodiments, crystal orientation and crystal plane of a crystal grain can be represented based on a coordinate system. As shown in FIG. 17, a hexagonal crystal grain, such as an aluminum nitride crystal grain, can be represented by an ac three-dimensional coordinate system (including a-axis and c-axis). As shown in FIG. 18, crystal grains of (i) an orthorhombic system (a≠b≠c), (ii) a tetragonal system (a=b≠c), (iii) a cubic system (a=b=c), etc., can be represented by an xyz three-dimensional coordinate system (including x-axis, y-axis and z-axis). In addition to these two examples, crystal grains can also be represented based on other coordinate systems, and therefore the present disclosure is not limited by the two embodiments described above.

According to the embodiment, the first crystal grain may be represented based on a first three-dimensional coordinate system, and the second crystal grain may be represented based on a second three-dimensional coordinate system. The first three-dimensional coordinate system includes at least a first coordinate axis along a first direction and a third coordinate axis along a third direction, and the second three-dimensional coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In the embodiment of the present disclosure, the first direction and the second direction are the same or opposite. It should be noted that the first direction and the second direction being the same refers to an included angle between a vector along the first direction and a vector along the second direction ranges from 0 degree to 5 degrees; and the first direction and the second direction being opposite refers to an included angle between the vector along the first direction and the vector along the second direction ranges from 175 degrees to 180 degrees.

In another embodiment, the first three-dimensional coordinate system is an ac three-dimensional coordinate system, and the first coordinate axis is a first c-axis, and the third coordinate axis is a first a-axis. The second three-dimensional coordinate system is an ac three-dimensional coordinate system, and the second coordinate axis is a second c-axis, the fourth coordinate axis is a second a-axis, and the first c-axis and the second c-axis are in the same direction or in opposite direction.

In another embodiment, the first three-dimensional coordinate system further includes a fifth coordinate axis along a fifth direction, and the second three-dimensional coordinate system further includes a sixth coordinate axis along a sixth direction. In another embodiment, the first direction and the second direction are the same or opposite, the third direction and the fourth direction are the same or opposite. It should be noted that the third direction and the fourth direction being the same refers to an included angle between a vector along the third direction and a vector along the fourth direction ranges from 0 degree to 5 degrees; and the third direction and the fourth direction being opposite refers to an included angle between the vector along the third direction and the vector along the fourth direction ranges from 175 degrees to 180 degrees.

In another embodiment, the first three-dimensional coordinate system is an xyz three-dimensional coordinate system, and the first coordinate axis is a first z-axis, the third coordinate axis is a first y-axis, and the fifth coordinate axis is a first x-axis. The second three-dimensional coordinate system is an xyz three-dimensional coordinate system, and the second coordinate axis is a second z-axis, the fourth coordinate axis is a second y-axis, and the sixth coordinate axis is a second x-axis. In another embodiment, the first z-axis and the second z-axis are in the same direction, and the first y-axis and the second y-axis are in the same direction. In another embodiment, the first z-axis and the second z-axis are in opposite direction, and the first y-axis and the second y-axis are in opposite direction. In another embodiment, the first z-axis and the second z-axis are in the same direction, and the first y-axis and the second y-axis are in opposite direction. In another embodiment, the first z-axis and the second z-axis are in opposite direction, and the first y-axis and the second y-axis are in the same direction.

In the embodiment, the method 200 for forming a bulk acoustic wave resonance device further includes: removing the first sub-piezoelectric layer after S207, and the first side corresponds to a side of the second sub-piezoelectric layer; and retaining the lithographic mark at an end of the second sub-piezoelectric layer, and the lithographic mark is disposed at the first side, and the second electrode layer is in contact with the second sub-piezoelectric layer.

In the embodiment, S209 includes: forming the second electrode layer based on the lithographic mark, and the second electrode layer is in contact with the second sub-piezoelectric layer.

It should be noted that since a lattice of the material of the first substrate and a lattice of a material of a piezoelectric layer do not match, the piezoelectric layer is divided into two sub-piezoelectric layers based on different crystal qualities. In one embodiment, the first sub-piezoelectric layer is a transition layer between the first substrate and the second sub-piezoelectric layer and has a relatively low crystal quality; and the second sub-piezoelectric layer is disposed on the first sub-piezoelectric layer and has a relatively high crystal quality. In the embodiment, after removing the first substrate, the first sub-piezoelectric layer with relatively low lattice quality can be further removed, and the second sub-piezoelectric layer with relatively high lattice quality can be retained, thus is conducive to improve the electromechanical coupling factor of the resonance device and the Q value of the resonance device.

In addition, the lithographic mark can conduct a calibration, aligning the disposed second electrode layer with respect to the lithographic mark, and thus can improve the accuracy.

In an embodiment of the present disclosure, the method 200 for forming a bulk acoustic wave resonance device includes S201, S203, S205, S207, S209, S211 and S213.

In S201, forming a first stack, and the forming the first stack includes: providing a first substrate; forming a piezoelectric layer on the first substrate; forming a first electrode layer on the piezoelectric layer; forming a cavity preprocessing layer on the piezoelectric layer, and a cavity is to be formed based on the cavity preprocessing layer, the cavity preprocessing layer at least covers a first end of the first electrode layer, and the cavity preprocessing layer is in contact with the piezoelectric layer, a first side of the first stack corresponds to a side of the first substrate, and a second side of the first stack corresponds to a side of the cavity preprocessing layer, that is, the first side is opposite to the second side.

In S203, forming a second stack, and the forming the second stack includes: providing a second substrate.

In S205, joining the first stack and the second stack, and the second stack is disposed at the second side.

In S207, removing the first substrate, and the first side corresponds to a side of the piezoelectric layer.

In S209, forming a second electrode layer at the first side, and the second electrode layer is in contact with the piezoelectric layer.

In S211, etching the cavity preprocessing layer for forming the cavity, and the first end is disposed in the cavity.

In S213, removing the second stack.

In the embodiment, the method 200 for forming a bulk acoustic wave resonance device further includes: forming a periphery structure at the first side before S209, and the periphery structure is in contact with the piezoelectric layer. In the embodiment, the periphery structure is a ring structure.

In the embodiment, the forming the periphery structure includes: forming a metal periphery structure at the first side, and the metal periphery structure is in contact with the piezoelectric layer. In another embodiment, the forming the periphery structure includes: forming a polymer periphery structure at the first side, and the polymer periphery structure is in contact with the piezoelectric layer; and forming a metal periphery structure on the polymer periphery structure.

In the embodiment, the forming the periphery structure further includes: etching an inner side of the metal periphery structure (or, an inner side of the periphery structure) to form a slope. In the embodiment, an etching angle for etching the inner side of the metal periphery structure is within a range from 1 degree to 89 degrees.

In the embodiment, S209 includes: forming a second electrode layer at an inner side of the periphery structure.

It should be noted that the periphery structure is disposed at an outer side of the periphery of the second electrode layer, and the disposed surrounding periphery of the second electrode layer may restrain a leakage of transverse waves, and the Q value of the resonance device can be improved. Furthermore, the periphery structure is disposed within the resonance region, and the resonance region at least includes the piezoelectric layer, the first electrode layer, the periphery structure and the second electrode layer. In addition, the inner side of the periphery structure presents a slope, and the outer side is upright, which can increase an impedance of the periphery structure, thereby better restraining the leakage of transverse waves.

In an embodiment of the present disclosure, the method 200 for forming a bulk acoustic wave resonance device includes S201, S203, S205, S207, S209, S211 and S213.

In S201, forming a first stack, and the forming the first stack includes: providing a first substrate; forming a piezoelectric layer on the first substrate; forming a first electrode layer on the piezoelectric layer; forming a cavity preprocessing layer on the piezoelectric layer, and a cavity is to be formed based on the cavity preprocessing layer, the cavity preprocessing layer at least covers a first end of the first electrode layer, and the cavity preprocessing layer is in contact with the piezoelectric layer, a first side of the first stack corresponds to a side of the first substrate, and a second side of the first stack corresponds to a side of the cavity preprocessing layer, that is, the first side is opposite to the second side.

In S203, forming a second stack, and the forming the second stack includes: providing a second substrate.

In S205, joining the first stack and the second stack, and the second stack is disposed at the second side.

In S207, removing the first substrate, and the first side corresponds to a side of the piezoelectric layer.

In S209, forming a second electrode layer at the first side, and the second electrode layer is in contact with the piezoelectric layer.

In S211, etching the cavity preprocessing layer for forming the cavity, and the first end is disposed in the cavity.

In S213, removing the second stack.

In the embodiment, S201 further includes: forming a lithographic mark before forming the piezoelectric layer. In the embodiment, the forming the lithographic mark includes: forming an opening at an end of the first substrate; and forming the lithographic mark in the opening.

In the embodiment, the lithographic mark is made of, but not limited to, at least one selected from a group consisting of: aluminum nitride, aluminum nitride alloy, gallium nitride, zinc oxide, lithium tantalate, lithium niobate, lead zirconatetitanate, and lead magnesium niobate-lead titanate. In the embodiment, the piezoelectric layer is made of, but not limited to, at least one selected from a group consisting of: aluminum nitride, aluminum nitride alloy, gallium nitride, zinc oxide, lithium tantalate, lithium niobate, lead zirconatetitanate, and lead magnesium niobate-lead titanate. In the embodiment, the lithographic mark is the same as the material of the piezoelectric layer. In another embodiment, the lithographic mark is made of a material different from the material of the piezoelectric layer.

In the embodiment, S207 further includes: retaining the lithographic mark at an end of the piezoelectric layer, and the lithographic mark is disposed at the first side, and the lithographic mark is in contact with the piezoelectric layer.

In the embodiment, the method 200 for forming a bulk acoustic wave resonance device further includes: before S209, forming a periphery structure at the first side, and the periphery structure is in contact with the piezoelectric layer based on the lithographic mark. In the embodiment, the periphery structure is a ring structure.

In the embodiment, the forming the periphery structure includes: forming a metal periphery structure at the first side, and the metal periphery structure is in contact with the piezoelectric layer based on the lithographic mark. In another embodiment, the forming the periphery structure includes: forming a polymer periphery structure at the first side, and the polymer periphery structure is in contact with the piezoelectric layer based on the lithographic mark; and forming a metal periphery structure on the polymer periphery structure.

In the embodiment, the forming the periphery structure further includes: etching an inner side of the metal periphery structure (or, an inner side of the periphery structure) to form a slope. In the embodiment, an etching angle for etching the inner side of the metal periphery structure is within a range from 1 degree to 89 degrees.

In the embodiment, S209 includes: forming a second electrode layer at an inner side of the periphery structure based on the lithographic mark.

It should be noted that the lithographic mark can conduct a calibration, aligning the disposed periphery structure or the second electrode layer with respect to the lithographic mark can improve the accuracy.

In addition, the periphery structure is at an outer side of the periphery of the second electrode layer, and the disposed surrounding periphery of the second electrode layer may restrain a leakage of transverse waves, and the Q value of the resonance device can be improved. Furthermore, the periphery structure is disposed within the resonance region, and the resonance region at least includes the piezoelectric layer, the first electrode layer, the periphery structure and the second electrode layer. In addition, the inner side of the periphery structure presents a slope, and the outer side is upright, which can increase an impedance of the periphery structure, thereby better restraining the leakage of transverse waves.

Combining the cross-sectional structure diagrams of a bulk acoustic wave resonance device, embodiments of the present disclosure provide the following three specific methods for forming a bulk acoustic wave resonance device for better understanding of the present disclosure. The present disclosure may be practiced otherwise than as specifically described herein, and therefore the present disclosure is not limited by the specific embodiments disclosed below.

FIG. 4-FIG. 8 schematically illustrate structure diagrams of cross-section A of a method for forming a bulk acoustic wave resonance device according to an embodiment of the present disclosure.

Figure 4:
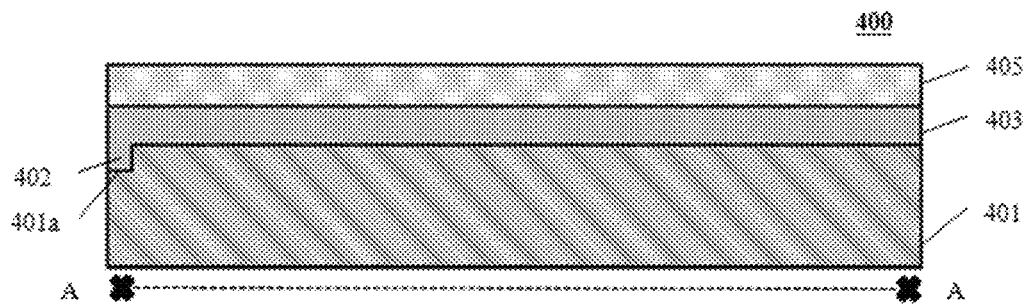
FIG. 4-FIG. 8 schematically illustrate cross-sectional structure diagrams of a method for forming a bulk acoustic wave resonance device according to an embodiment of the present disclosure.

As shown in FIG. 4, the method for forming a bulk acoustic wave resonance device includes: forming a first stack, and the forming the first stack includes the following steps.

Providing a substrate 401.

Forming an opening 401a at an end of the substrate 401.

Forming a lithographic mark 402 in the opening 401a.

Forming a sub-piezoelectric layer 403 on the substrate 401 and the lithographic mark 402.

Forming a sub-piezoelectric layer 405 on the sub-piezoelectric layer 403.

In the embodiment, the substrate 401 is made of, but not limited to, at least one selected from a group consisting of: silicon, silicon carbide, and glass.

In the embodiment, the lithographic mark 402 is made of, but not limited to, at least one selected from a group consisting of: aluminum nitride, aluminum nitride alloy, gallium nitride, zinc oxide, lithium tantalate, lithium niobate, lead zirconatetitanate, and lead magnesium niobate-lead titanate. In the embodiment, the sub-piezoelectric layer 403 is made of, but not limited to, at least one selected from a group consisting of: aluminum nitride, aluminum nitride alloy, gallium nitride, zinc oxide, lithium tantalate, lithium niobate, lead zirconatetitanate, and lead magnesium niobate-lead titanate. In the embodiment, the lithographic mark 402 is made of the same material as the material of the sub-piezoelectric layer 403. In another embodiment, the lithographic mark 402 is made of a material different from the material of the sub-piezoelectric layer 403.

In the embodiment, the sub-piezoelectric layer 405 is made of, but not limited to, at least one selected from a group consisting of: aluminum nitride, aluminum nitride alloy, gallium nitride, zinc oxide, lithium tantalate, lithium niobate, lead zirconatetitanate, and lead magnesium niobate-lead titanate. In the embodiment, the sub-piezoelectric layer 403 is made of the same material as the material of the sub-piezoelectric layer 405. In another embodiment, the sub-piezoelectric layer 403 is made of a material different from the material of the sub-piezoelectric layer 405.

In the embodiment, an FWHM of a rocking curve of the sub-piezoelectric layer 403 is higher than 1.7 degrees; an FWHM of a rocking curve of the sub-piezoelectric layer 405 is lower than 1.7 degrees. It should be noted that the rocking curve describes a magnitude of an angular divergence of a specific crystal plane (determined by a diffraction angle) in a sample and is represented by a plane coordinate system. In one embodiment, a horizontal axis represents an included angle between the crystal plane and the sample plane, a vertical axis represents a diffraction intensity of the crystal plane at a certain included angle. The rocking curve indicates a crystal quality, and the smaller the FWHM of the rocking curve is, the higher the crystal quality is (that is, an FWHM of a rocking curve being lower than 1.7 degrees means a relatively high crystal quality, an FWHM of a rocking curve being higher than 1.7 degrees means a relatively low crystal quality). In addition, an FWHM indicates an interval between two points whose function values are equal to a half of a peak value of the function.

It should be noted that since a lattice of the material of the substrate 401 and a lattice of a material of a piezoelectric layer do not match, the piezoelectric layer is divided into two sub-piezoelectric layers based on different crystal qualities. In one embodiment, the sub-piezoelectric layer 403 is a transition layer between the substrate 401 and the sub-piezoelectric layer 405 and has a relatively low crystal quality; and the sub-piezoelectric layer 405 is disposed on the sub-piezoelectric layer 403 and has a relatively high crystal quality.

In the embodiment, the sub-piezoelectric layer 405 includes crystal grains, and crystal grains include a first crystal grain and a second crystal grain, and the first crystal grain and the second crystal grains are any two crystal grains among crystal grains. In some embodiments, crystal orientation and crystal plane of a crystal grain can be represented based on a coordinate system. As shown in FIG. 17, a hexagonal crystal grain, such as an aluminum nitride crystal grain, can be represented by an ac three-dimensional coordinate system (including a-axis and c-axis). As shown in FIG. 18, crystal grains of (i) an orthorhombic system (a≠b≠c), (ii) a tetragonal system (a=b≠c), (iii) a cubic system (a=b=c), etc., can be represented by an xyz three-dimensional coordinate system (including x-axis, y-axis and z-axis). In addition to these two examples, crystal grains can also be represented based on other coordinate systems, and therefore the present disclosure is not limited by the two embodiments described above.

According to the embodiment, the first crystal grain may be represented based on a first three-dimensional coordinate system, and the second crystal grain may be represented based on a second three-dimensional coordinate system. The first three-dimensional coordinate system includes at least a first coordinate axis along a first direction and a third coordinate axis along a third direction, and the second three-dimensional coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In the embodiment of the present disclosure, the first direction and the second direction are the same or opposite. It should be noted that the first direction and the second direction being the same refers to an included angle between a vector along the first direction and a vector along the second direction ranges from 0 degree to 5 degrees; and the first direction and the second direction being opposite refers to an included angle between the vector along the first direction and the vector along the second direction ranges from 175 degrees to 180 degrees.

In another embodiment, the first three-dimensional coordinate system is an ac three-dimensional coordinate system, and the first coordinate axis is a first c-axis, and the third coordinate axis is a first a-axis. The second three-dimensional coordinate system is an ac three-dimensional coordinate system, and the second coordinate axis is a second c-axis, the fourth coordinate axis is a second a-axis, and the first c-axis and the second c-axis are in the same direction or in opposite direction.

In another embodiment, the first three-dimensional coordinate system further includes a fifth coordinate axis along a fifth direction, and the second three-dimensional coordinate system further includes a sixth coordinate axis along a sixth direction. In another embodiment, the first direction and the second direction are the same or opposite, the third direction and the fourth direction are the same or opposite. It should be noted that the third direction and the fourth direction being the same refers to an included angle between a vector along the third direction and a vector along the fourth direction ranges from 0 degree to 5 degrees; and the third direction and the fourth direction being opposite refers to an included angle between the vector along the third direction and the vector along the fourth direction ranges from 175 degrees to 180 degrees.

In another embodiment, the first three-dimensional coordinate system is an xyz three-dimensional coordinate system, and the first coordinate axis is a first z-axis, the third coordinate axis is a first y-axis, and the fifth coordinate axis is a first x-axis. The second three-dimensional coordinate system is an xyz three-dimensional coordinate system, and the second coordinate axis is a second z-axis, the fourth coordinate axis is a second y-axis, and the sixth coordinate axis is a second x-axis. In another embodiment, the first z-axis and the second z-axis are in the same direction, and the first y-axis and the second y-axis are in the same direction. In another embodiment, the first z-axis and the second z-axis are in opposite direction, and the first y-axis and the second y-axis are in opposite direction. In another embodiment, the first z-axis and the second z-axis are in the same direction, and the first y-axis and the second y-axis are in opposite direction. In another embodiment, the first z-axis and the second z-axis are in opposite direction, and the first y-axis and the second y-axis are in the same direction.

Figure 5:
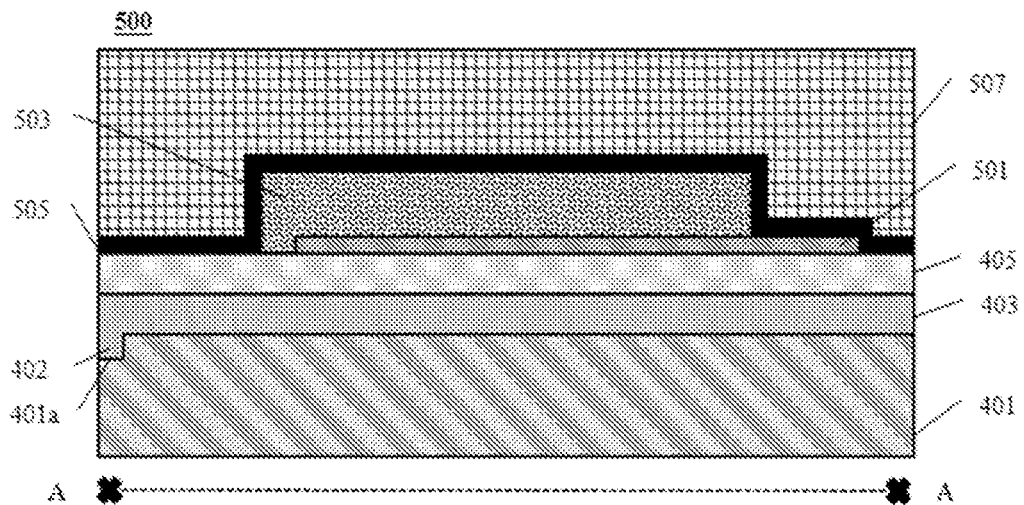

In the embodiment, referring to FIG. 5, the forming the first stack further includes the following steps.

Forming an electrode layer 501 on the sub-piezoelectric layer 405, and the electrode layer 501 is disposed at a first side of the sub-piezoelectric layer 405.

Forming a sacrificial layer 503 on the sub-piezoelectric layer 405 and covering a first end of the electrode layer 501.

Forming an etching shield layer 505 on the sub-piezoelectric layer 405 and covering the sacrificial layer 503 and a second end of the electrode layer 501.

Forming an intermediate layer 507 on the etching shield layer 505, and the etching shield layer 505 is disposed between the intermediate layer 507 and the sub-piezoelectric layer 405.

In the embodiment, the electrode layer 501 is made of, but not limited to, at least one selected from a group consisting of: molybdenum, ruthenium, tungsten, platinum, iridium and aluminum.

In the embodiment, the sacrificial layer 503 is made of, but not limited to, at least one selected from a group consisting of: polymer, silicon dioxide, doped silicon dioxide and polysilicon. In the embodiment, the polymer includes, but is not limited to, at least one selected from a group consisting of: BenzoCycloButene (BCB), photosensitive epoxy resin photoresist (such as SU-8), and polyimide. It should be noted that the doped silicon dioxide is silicon dioxide doped with other elements.

In the embodiment, the etching shield layer 505 is made of, but not limited to, at least one selected from a group consisting of: aluminum nitride, silicon carbide, diamond, silicon nitride, silicon dioxide, alumina, and titanium dioxide. In the embodiment, the etching shield layer 505 has a thickness ranging from, but is not limited to, 2 μm to 6 μm.

In the embodiment, the intermediate layer 507 is made of, but not limited to, at least one selected from a group consisting of: polymer, and insulating dielectric. In the embodiment, the polymer includes, but is not limited to, at least one selected from a group consisting of: BenzoCycloButene (BCB), photosensitive epoxy resin photoresist (such as SU-8), and polyimide. In the embodiment, the insulating dielectric includes, but is not limited to, at least one selected from a group consisting of: aluminum nitride, silicon dioxide, silicon nitride and titanium oxide. In some embodiments, the intermediate layer 507 has a thickness ranging from, but is not limited to, 20 μm to 100 μm. It should be noted that an acoustic impedance of the intermediate layer 507 may be relatively smaller than that of the sub-piezoelectric layer 405, and the intermediate layer 507 and the sub-piezoelectric layer 405 form an acoustic reflection structure to restrain a leakage of acoustic waves from the resonance region.

Figure 6:
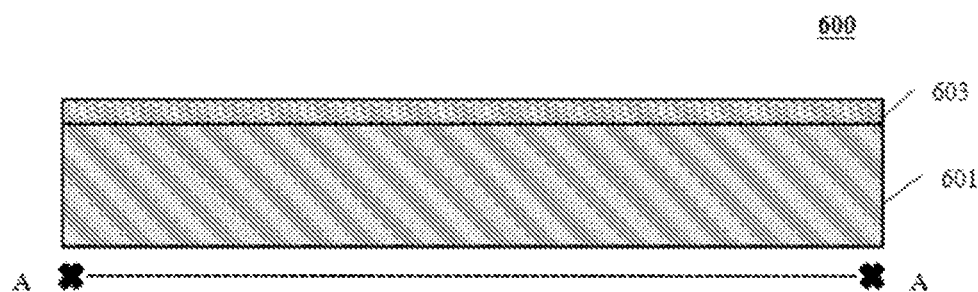

In the embodiment, referring to FIG. 6, the method for forming a bulk acoustic wave resonance device further includes: forming a second stack, and the forming the second stack includes the following steps.

Providing a substrate 601.

Forming an intermediate layer 603 on the substrate 601.

In the embodiment, the substrate 601 is made of, but not limited to, at least one selected from a group consisting of: silicon, silicon carbide, and glass.

In the embodiment, the intermediate layer 603 is made of, but not limited to, a chemical substance with low surface energy. In the embodiment, the chemical substance with low surface energy includes, but is not limited to, at least one selected from a group consisting of: 1H,1H,2H,2H-perfluoroheptadecane trimethoxysilane, polydimethylsiloxane, hydrocarbons, fluorocarbons, polyethylene, polypropylene, and polytetrafluoroethylene.

Figure 7:
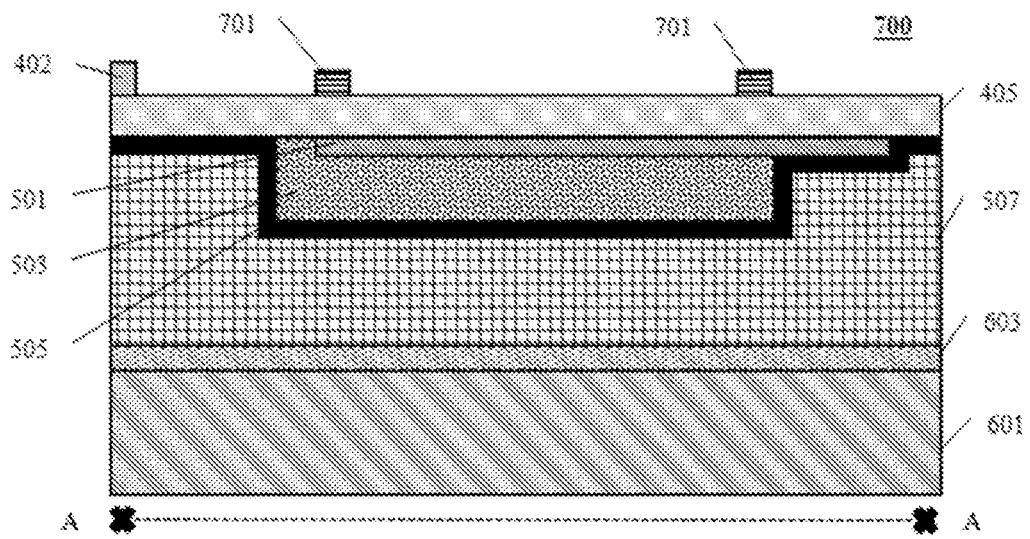

In the embodiment, referring to FIG. 7, the method for forming a bulk acoustic wave resonance device further includes the following steps.

Adhering the intermediate layer 507 to the intermediate layer 603.

Removing the substrate 401.

Removing the sub-piezoelectric layer 403, retaining the lithographic mark 402 at an end of the sub-piezoelectric layer 405, and the lithographic mark 402 is disposed at a second side of the sub-piezoelectric layer 405, and the second side is opposite to the first side of the sub-piezoelectric layer 405.

Forming a periphery structure 701 at the second side based on the lithographic mark 402, and the periphery structure 701 is in contact with the sub-piezoelectric layer 405.

In the embodiment, adhering the intermediate layer 507 to the intermediate layer 603 includes: applying pressure to the intermediate layer 507 and the intermediate layer 603 for adhering the intermediate layer 507 to the intermediate layer 603.

In the embodiment, the periphery structure 701 is a ring structure.

In the embodiment, the forming the periphery structure 701 includes: forming a metal periphery structure at the second side based on the lithographic mark 402, and the metal periphery structure is in contact with the sub-piezoelectric layer 405. In another embodiment, the forming the periphery structure 701 includes: forming a polymer periphery structure at the second side based on the lithographic mark 402, and the polymer periphery structure is in contact with the sub-piezoelectric layer 405; and forming a metal periphery structure on the polymer periphery structure.

In another embodiment, the forming the periphery structure 701 further includes: etching an inner side of the metal periphery structure (or, an inner side of the periphery structure 701) to form a slope. In another embodiment, an etching angle for etching the inner side of the metal periphery structure is within a range from 1 degree to 89 degrees.

In the embodiment, an etching angle for etching the metal periphery structure is within a range from 30 degrees to 75 degrees.

It should be noted that after removing the substrate 401, the sub-piezoelectric layer 403 is further removed, and the sub-piezoelectric layer 405 with relatively high crystal quality is retained, thus is conducive to improve the electromechanical coupling factor of the resonance device and the Q value of the resonance device.

Figure 8:
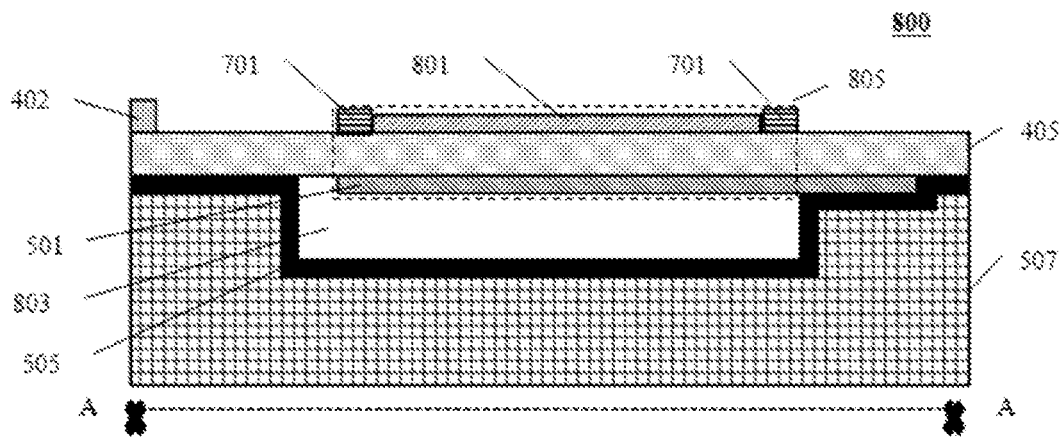

In the embodiment, referring to FIG. 8, the method for forming a bulk acoustic wave resonance device further includes the following steps.

Forming an electrode layer 801 at the second side based on the lithographic mark 402, and the electrode layer 801 is in contact with the sub-piezoelectric layer 405, and the electrode layer 801 is disposed at the inner side of the periphery structure 701.

Etching and removing the sacrificial layer 503 to form a cavity 803, and the first end of the electrode layer 504 is disposed in the cavity 803.

Separating the intermediate layer 507 and the intermediate layer 603 to remove the intermediate layer 603 and the substrate 601, that is, to remove the second stack.

In the embodiment, the electrode layer 801 is made of, but not limited to, at least one selected from a group consisting of: molybdenum, ruthenium, tungsten, platinum, iridium and aluminum.

In the embodiment, the etching method includes, but is not limited to, at least one selected from a group consisting of: oxygen ions etching, xenon difluoride etching and hydrofluoric acid etching.

In the embodiment, separating the intermediate layer 507 and the intermediate layer 603 includes: heating the intermediate layer 603 to make the intermediate layer 603 lose its viscidity, to separate the intermediate layer 507 and the intermediate layer 603.

It should be noted that the lithographic mark 402 can conduct a calibration, and aligning the disposed periphery structure 701 and the electrode layer 801 with respect to the lithographic mark 402 can improve the accuracy.

In addition, the periphery structure 701 is disposed at an outer side of the periphery of the electrode layer 801, and the disposed surrounding periphery of the electrode layer 801 may restrain a leakage of transverse waves, and the Q value of the resonance device can be improved.

Furthermore, the periphery structure 701 is disposed within the resonance region 805, and the resonance region 805 at least includes the sub-piezoelectric layer 405, the electrode layer 501, the periphery structure 701 and the electrode layer 801, the resonance region 805 is suspended relative to the cavity 803 and does not overlap with the intermediate layer 507.

In addition, the inner side of the periphery structure 701 presents a slope, and the outer side is upright, which can increase an impedance of the periphery structure 701, thereby better restraining the leakage of transverse waves.

In addition, when etching and removing the sacrificial layer 503 to form the cavity 803, the etching shield layer 505 may serve to protect the intermediate layer 801. In addition, the etching shield layer 505 may serve to protect the resonance device from being corroded by water or oxygen.

In addition, removing the substrate 601 can eliminate electrical losses caused by the substrate 601.

In addition, using the intermediate layer 603 with a low surface energy material helps to facilitate the removal of the substrate 601, and can better protect the substrate 601 to be recyclable, which reduces fabrication costs.

In general, embodiments of the present disclosure have following benefits:

(1) The sub-piezoelectric layer 403 and the sub-piezoelectric layer 405 are disposed on the substrate 401, and a surface of the substrate 401 is flat, which results in the sub-piezoelectric layer 405 includes crystal grains not suffering from a significant change to their orientation, thus is conducive to improve electromechanical coupling factor of the resonance device and a Q value of the resonance device.

(2) Removing the substrate 601 can eliminate electrical losses caused by the substrate 601. In addition, using the intermediate layer 603 with a low surface energy material is conducive to facilitate the removal of the substrate 601, and can better protect the substrate 601 to be recyclable, which reduces fabrication costs.

(3) After removing the substrate 401, the sub-piezoelectric layer 403 with relatively low crystal quality can be further removed, and the sub-piezoelectric layer 405 with relatively high crystal quality can be retained, thus is conducive to improve the electromechanical coupling factor of the resonance device and the Q value of the resonance device.

(4) The lithographic mark 402 can conduct a calibration, and aligning the disposed periphery structure 701 and the electrode layer 801 with respect to the lithographic mark 402 can improve the accuracy.

FIG. 9-FIG. 12 schematically illustrate structure diagrams of cross-section A of a method for forming a bulk acoustic wave resonance device according to an embodiment of the present disclosure.

Figure 9:
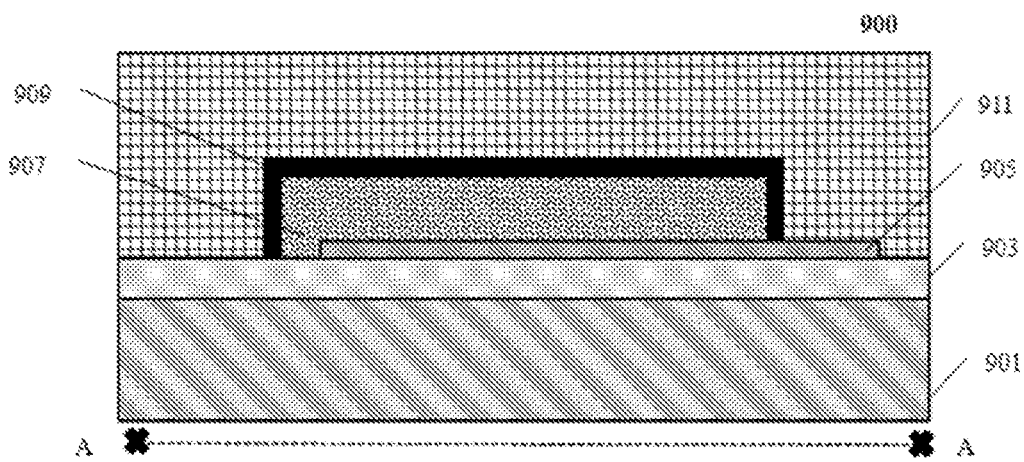
FIG. 9-FIG. 12 schematically illustrate cross-sectional structure diagrams of another method for forming a bulk acoustic wave resonance device according to an embodiment of the present disclosure.

As shown in FIG. 9, the method for forming a bulk acoustic wave resonance device provided in embodiments of the present disclosure includes: forming a first stack, and the forming the first stack includes the following steps.

Providing a substrate 901.

Forming a piezoelectric layer 903 on the substrate 901.

Forming an electrode layer 905 on the piezoelectric layer 903, and the electrode layer 905 is disposed at a first side of the piezoelectric layer 903.

Forming a sacrificial layer 907 on the piezoelectric layer 903 and covering a first end of the electrode layer 905.

Forming an etching shield layer 909 on the piezoelectric layer 903 and covering the sacrificial layer 907.

Forming an intermediate layer 911 on the piezoelectric layer 903, and covering the etching shield layer 909 and a second end of the electrode layer 905, and the intermediate layer 911 is in contact with the piezoelectric layer 903.

In the embodiment, the substrate 901 is made of, but not limited to, at least one selected from a group consisting of: silicon, silicon carbide, and glass.

In the embodiment, the piezoelectric layer 903 is made of, but not limited to, at least one selected from a group consisting of: aluminum nitride, aluminum nitride alloy, gallium nitride, zinc oxide, lithium tantalate, lithium niobate, lead zirconatetitanate, and lead magnesium niobate-lead titanate.

In the embodiment, the piezoelectric layer 903 includes crystal grains, and crystal grains include a first crystal grain and a second crystal grain, and the first crystal grain and the second crystal grain are any two crystal grains among crystal grains. In some embodiments, crystal orientation and crystal plane of a crystal grain can be represented based on a coordinate system. As shown in FIG. 17, a hexagonal crystal grain, such as an aluminum nitride crystal grain, can be represented by an ac three-dimensional coordinate system (including a-axis and c-axis). As shown in FIG. 18, crystal grains of (i) an orthorhombic system (a≠b≠c), (ii) a tetragonal system (a=b≠c), (iii) a cubic system (a=b=c), etc., can be represented by an xyz three-dimensional coordinate system (including x-axis, y-axis and z-axis). In addition to these two examples, crystal grains can also be represented based on other coordinate systems, and therefore the present disclosure is not limited by the two embodiments described above.

According to the embodiment, the first crystal grain may be represented based on a first three-dimensional coordinate system, and the second crystal grain may be represented based on a second three-dimensional coordinate system. The first three-dimensional coordinate system includes at least a first coordinate axis along a first direction and a third coordinate axis along a third direction, and the second three-dimensional coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In the embodiment of the present disclosure, the first direction and the second direction are the same or opposite. It should be noted that the first direction and the second direction being the same refers to an included angle between a vector along the first direction and a vector along the second direction ranges from 0 degree to 5 degrees; and the first direction and the second direction being opposite refers to an included angle between the vector along the first direction and the vector along the second direction ranges from 175 degrees to 180 degrees.

In another embodiment, the first three-dimensional coordinate system is an ac three-dimensional coordinate system, and the first coordinate axis is a first c-axis, and the third coordinate axis is a first a-axis. The second three-dimensional coordinate system is an ac three-dimensional coordinate system, and the second coordinate axis is a second c-axis, the fourth coordinate axis is a second a-axis, and the first c-axis and the second c-axis are in the same direction or in opposite direction.

In another embodiment, the first three-dimensional coordinate system further includes a fifth coordinate axis along a fifth direction, and the second three-dimensional coordinate system further includes a sixth coordinate axis along a sixth direction. In another embodiment, the first direction and the second direction are the same or opposite, the third direction and the fourth direction are the same or opposite. It should be noted that the third direction and the fourth direction being the same refers to an included angle between a vector along the third direction and a vector along the fourth direction ranges from 0 degree to 5 degrees; and the third direction and the fourth direction being opposite refers to an included angle between the vector along the third direction and the vector along the fourth direction ranges from 175 degrees to 180 degrees.

In another embodiment, the first three-dimensional coordinate system is an xyz three-dimensional coordinate system, and the first coordinate axis is a first z-axis, the third coordinate axis is a first y-axis, and the fifth coordinate axis is a first x-axis. The second three-dimensional coordinate system is an xyz three-dimensional coordinate system, and the second coordinate axis is a second z-axis, the fourth coordinate axis is a second y-axis, and the sixth coordinate axis is a second x-axis. In another embodiment, the first z-axis and the second z-axis are in the same direction, and the first y-axis and the second y-axis are in the same direction. In another embodiment, the first z-axis and the second z-axis are in opposite direction, and the first y-axis and the second y-axis are in opposite direction. In another embodiment, the first z-axis and the second z-axis are in the same direction, and the first y-axis and the second y-axis are in opposite direction. In another embodiment, the first z-axis and the second z-axis are in opposite direction, and the first y-axis and the second y-axis are in the same direction.

In the embodiment, the piezoelectric layer 903 includes crystal grains, and an FWHM of a rocking curve of a crystal made of crystal grains is lower than 2.5 degrees. It should be noted that the rocking curve describes a magnitude of an angular divergence of a specific crystal plane (determined by a diffraction angle) in a sample and is represented by a plane coordinate system. In one embodiment, a horizontal axis represents an included angle between the crystal plane and the sample plane, a vertical axis represents a diffraction intensity of the crystal plane at a certain included angle. The rocking curve indicates a crystal quality, and the smaller the FWHM of the rocking curve is, the higher the crystal quality is. In addition, an FWHM indicates an interval between two points whose function values are equal to a half of a peak value of the function.

In the embodiment, the electrode layer 905 is made of, but not limited to, at least one selected from a group consisting of: molybdenum, ruthenium, tungsten, platinum, iridium and aluminum.

In the embodiment, the sacrificial layer 907 is made of, but not limited to, at least one selected from a group consisting of: polymer, silicon dioxide, doped silicon dioxide and polysilicon. In the embodiment, the polymer includes, but is not limited to, at least one selected from a group consisting of: BenzoCycloButene (BCB), photosensitive epoxy resin photoresist (such as SU-8), and polyimide.

It should be noted that the doped silicon dioxide is silicon dioxide doped with other elements.

In the embodiment, the etching shield layer 909 is made of, but not limited to, at least one selected from a group consisting of: aluminum nitride, silicon carbide, diamond, silicon nitride, silicon dioxide, alumina, and titanium dioxide. In the embodiment, the etching shield layer 505 has a thickness ranging from, but is not limited to, 2 μm to 6 μm.

In the embodiment, the intermediate layer 911 is made of, but not limited to, at least one selected from a group consisting of: polymer, and insulating dielectric. In the embodiment, the polymer includes, but is not limited to, at least one selected from a group consisting of: BenzoCycloButene (BCB), photosensitive epoxy resin photoresist (such as SU-8), and polyimide. In the embodiment, the insulating dielectric includes, but is not limited to, at least one selected from a group consisting of: aluminum nitride, silicon dioxide, silicon nitride and titanium oxide. In some embodiments, the intermediate layer 911 has a thickness ranging from, but is not limited to, 20 μm to 100 μm. It should be noted that an acoustic impedance of the intermediate layer 911 may be relatively smaller than that of the piezoelectric layer 903, and the intermediate layer 911 and the piezoelectric layer 903 form an acoustic reflection structure to restrain a leakage of acoustic waves from the resonance region.

It should be noted that the piezoelectric layer 903 is disposed on the substrate 901, and a surface of the substrate 901 is flat, which results in the piezoelectric layer 903 includes crystal grains not suffering from a significant change to their orientation, thus is conducive to improve electromechanical coupling factor of the resonance device and a Q value of the resonance device.

Figure 10:
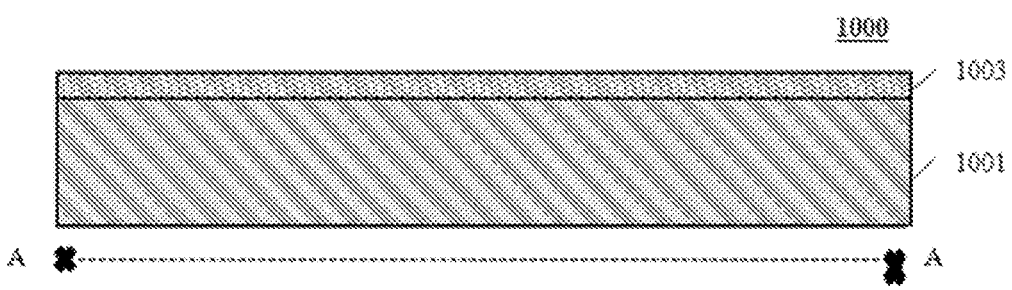

In the embodiment, referring to FIG. 10, the method for forming a bulk acoustic wave resonance device further includes: forming a second stack, and the forming the second stack includes the following steps.

Providing a substrate 1001.

Forming an intermediate layer 1003 on the substrate 1001.

In the embodiment, the substrate 1001 is made of, but not limited to, at least one selected from a group consisting of: silicon, silicon carbide, and glass.

In the embodiment, the intermediate layer 1003 is made of, but not limited to, a chemical substance with low surface energy. In the embodiment, the chemical substance with low surface energy includes, but is not limited to, at least one selected from a group consisting of: 1H,1H,2H,2H-perfluoroheptadecane trimethoxysilane, polydimethylsiloxane, hydrocarbons, fluorocarbons, polyethylene, polypropylene, and polytetrafluoroethylene.

Figure 11:
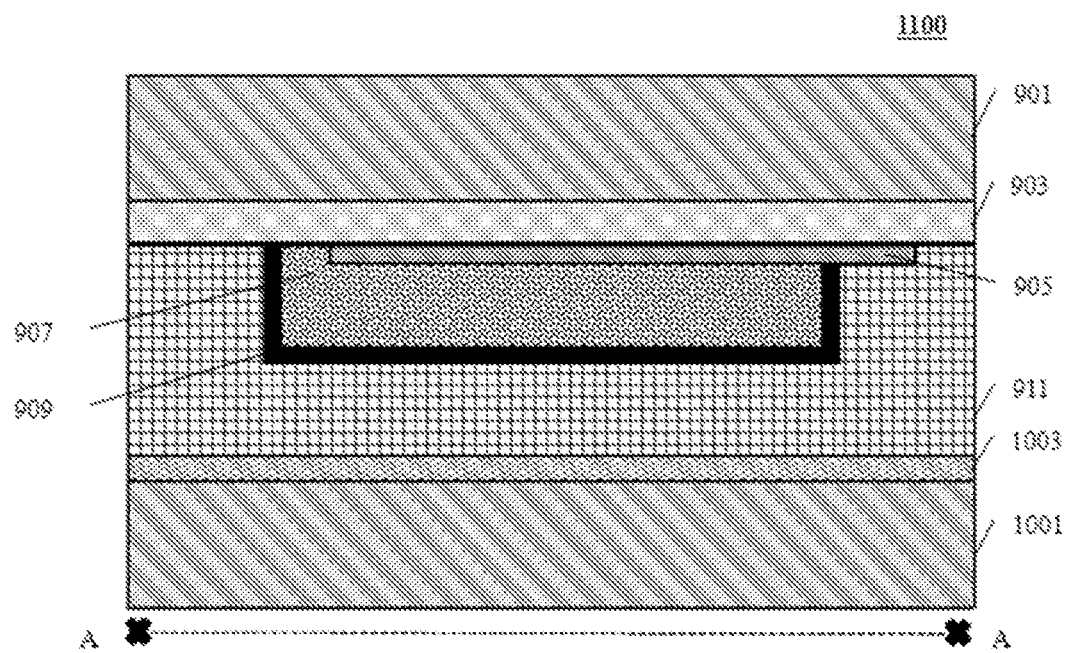

In the embodiment, referring to FIG. 11, the method for forming a bulk acoustic wave resonance device further includes: adhering the intermediate layer 911 to the intermediate layer 1003.

In the embodiment, the adhering the intermediate layer 911 to the intermediate layer 1003 includes: applying pressure to the intermediate layer 911 and the intermediate layer 1003 for adhering the intermediate layer 911 to the intermediate layer 1003.

Figure 12:
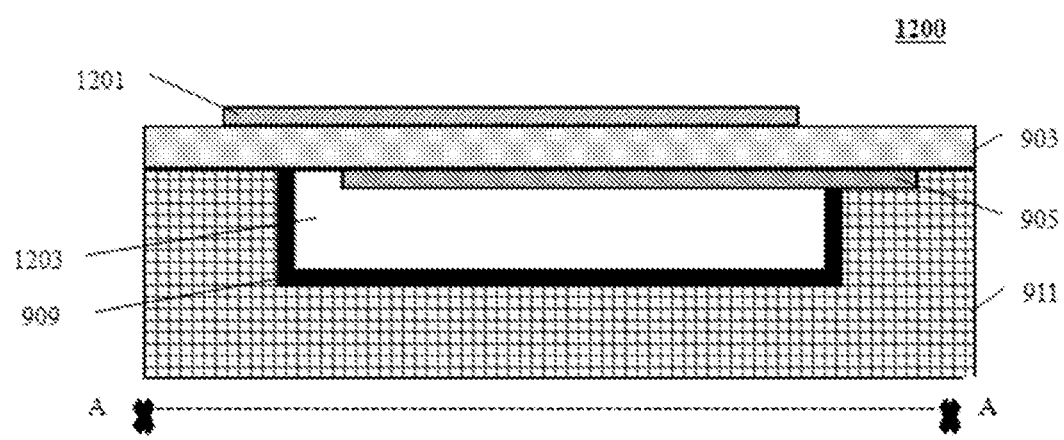

In the embodiment, referring to FIG. 12, the method for forming a bulk acoustic wave resonance device further includes the following steps.

Removing the substrate 901.

Forming an electrode layer 1201 at a second side of the piezoelectric layer 903, and the electrode layer 1201 is in contact with the piezoelectric layer 903, and the second side is opposite to the first side.

Etching and removing the sacrificial layer 907 for forming a cavity 1203, and the first end of the electrode layer 905 is disposed in the cavity 1203.

Separating the intermediate layer 911 and the intermediate layer 1003 to remove the intermediate layer 1003 and the substrate 1001, that is, to remove the second stack.

In the embodiment, the electrode layer 1201 is made of, but not limited to, at least one selected from a group consisting of: molybdenum, ruthenium, tungsten, platinum, iridium and aluminum.

In the embodiment, the etching method includes, but is not limited to, at least one selected from a group consisting of: oxygen ions etching, xenon difluoride etching and hydrofluoric acid etching.

In the embodiment, separating the intermediate layer 911 and the intermediate layer 1003 includes: heating the intermediate layer 1003 to make the intermediate layer 1003 lose its viscidity, to separate the intermediate layer 911 and the intermediate layer 1003.

It should be noted that when etching and removing the sacrificial layer 907 to form the cavity 1203, the etching shield layer 909 may serve to protect the intermediate layer 911. In addition, the etching shield layer 909 may serve to protect the resonance device from being corroded by water or oxygen.

In addition, removing the substrate 1001 can eliminate electrical losses caused by the substrate 1001.

In addition, using the intermediate layer 1003 with a low surface energy material helps to facilitate the removal of the substrate 1001, and can better protect the substrate 1001 to be recyclable, which reduces fabrication costs.

In addition, the electrode layer 905, the piezoelectric layer 903 and the electrode layer 1201 form a resonance region, and the resonance region is suspended relative to the cavity 1203 and does not overlap with the intermediate layer 911.

FIG. 13-FIG. 16 schematically illustrate structure diagrams of cross-section A of a method for forming a bulk acoustic wave resonance device according to an embodiment of the present disclosure.

Figure 13:
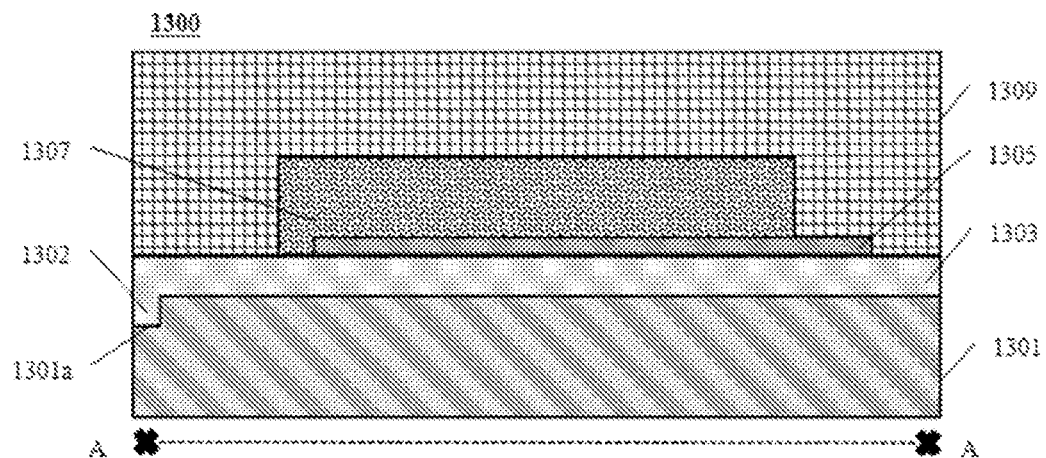
FIG. 13-FIG. 16 schematically illustrate cross-sectional structure diagrams of another method for forming a bulk acoustic wave resonance device according to an embodiment of the present disclosure.

As shown in FIG. 13, the method for forming a bulk acoustic wave resonance device provided in embodiments of the present disclosure includes: forming a first stack, and the forming the first stack includes the following steps.

Providing a substrate 1301.

Forming an opening 1301a at an end of the substrate 1301.

Forming a lithographic mark 1302 in the opening 1301a.

Forming a piezoelectric layer 1303 on the substrate 1301 and the lithographic mark 1302.

Forming an electrode layer 1305 on the piezoelectric layer 1303, and the electrode layer 1305 is disposed at a first side of the piezoelectric layer 1303.

Forming a sacrificial layer 1307 on the piezoelectric layer 1303, and covering a first end of the electrode layer 1305.

Forming an intermediate layer 1309 on the piezoelectric layer 1303, and the intermediate layer 1309 is in contact with the piezoelectric layer 1303, and the intermediate layer 1309 covers the sacrificial layer 1307 and a second end of the electrode layer 1305.

In the embodiment, the substrate 1301 is made of, but not limited to, at least one selected from a group consisting of: silicon, silicon carbide, and glass.

In the embodiment, the lithographic mark 1302 is made of, but not limited to, at least one selected from a group consisting of: aluminum nitride, aluminum nitride alloy, gallium nitride, zinc oxide, lithium tantalate, lithium niobate, lead zirconatetitanate, and lead magnesium niobate-lead titanate. In the embodiment, the piezoelectric layer 1303 is made of, but not limited to, at least one selected from a group consisting of: aluminum nitride, aluminum nitride alloy, gallium nitride, zinc oxide, lithium tantalate, lithium niobate, lead zirconatetitanate, and lead magnesium niobate-lead titanate. In the embodiment, the lithographic mark 1302 is made of the same material as the material of the piezoelectric layer 1303. In another embodiment, the lithographic mark 1302 is made of a material different from the material of the piezoelectric layer 1303.

In the embodiment, the piezoelectric layer 1303 includes crystal grains, and crystal grains include a first crystal grain and a second crystal grain, and the first crystal grain and the second crystal grain are any two crystal grains among crystal grains. In some embodiments, crystal orientation and crystal plane of a crystal grain can be represented based on a coordinate system. As shown in FIG. 17, a hexagonal crystal grain, such as an aluminum nitride crystal grain, can be represented by an ac three-dimensional coordinate system (including a-axis and c-axis). As shown in FIG. 18, crystal grains of (i) an orthorhombic system ($a \neq b \neq c$), (ii) a tetragonal system ($a = b \neq c$), (iii) a cubic system ($a = b = c$), etc., can be represented by an xyz three-dimensional coordinate system (including x-axis, y-axis and z-axis). In addition to these two examples, crystal grains can also be represented based on other coordinate systems, and therefore the present disclosure is not limited by the two embodiments described above.

According to the embodiment, the first crystal grain may be represented based on a first three-dimensional coordinate system, and the second crystal grain may be represented based on a second three-dimensional coordinate system. The first three-dimensional coordinate system includes at least a first coordinate axis along a first direction and a third coordinate axis along a third direction, and the second three-dimensional coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In the embodiment of the present disclosure, the first direction and the second direction are the same or opposite. It should be noted that the first direction and the second direction being the same refers to an included angle between a vector along the first direction and a vector along the second direction ranges from 0 degree to 5 degrees; and the first direction and the second direction being opposite refers to an included angle between the vector along the first direction and the vector along the second direction ranges from 175 degrees to 180 degrees.

In another embodiment, the first three-dimensional coordinate system is an ac three-dimensional coordinate system, and the first coordinate axis is a first c-axis, and the third coordinate axis is a first a-axis. The second three-dimensional coordinate system is an ac three-dimensional coordinate system, and the second coordinate axis is a second c-axis, the fourth coordinate axis is a second a-axis, and the first c-axis and the second c-axis are in the same direction or in opposite direction.

In another embodiment, the first three-dimensional coordinate system further includes a fifth coordinate axis along a fifth direction, and the second three-dimensional coordinate system further includes a sixth coordinate axis along a sixth direction. In another embodiment, the first direction and the second direction are the same or opposite, the third direction and the fourth direction are the same or opposite. It should be noted that the third direction and the fourth direction being the same refers to an included angle between a vector along the third direction and a vector along the fourth direction ranges from 0 degree to 5 degrees; and the third direction and the fourth direction being opposite refers to an included angle between the vector along the third direction and the vector along the fourth direction ranges from 175 degrees to 180 degrees.

In another embodiment, the first three-dimensional coordinate system is an xyz three-dimensional coordinate system, and the first coordinate axis is a first z-axis, the third coordinate axis is a first y-axis, and the fifth coordinate axis is a first x-axis. The second three-dimensional coordinate system is an xyz three-dimensional coordinate system, and the second coordinate axis is a second z-axis, the fourth coordinate axis is a second y-axis, and the sixth coordinate axis is a second x-axis. In another embodiment, the first z-axis and the second z-axis are in the same direction, and the first y-axis and the second y-axis are in the same direction. In another embodiment, the first z-axis and the second z-axis are in opposite direction, and the first y-axis and the second y-axis are in opposite direction. In another embodiment, the first z-axis and the second z-axis are in the same direction, and the first y-axis and the second y-axis are in opposite direction. In another embodiment, the first z-axis and the second z-axis are in opposite direction, and the first y-axis and the second y-axis are in the same direction.

In the embodiment, the piezoelectric layer 1303 includes crystal grains, and a Full Width at Half Maximum (FWHM) of a rocking curve of a crystal made of crystal grains is lower than 2.5 degrees. It should be noted that the rocking curve describes a magnitude of an angular divergence of a specific crystal plane (determined by a diffraction angle) in a sample and is represented by a plane coordinate system. In one embodiment, a horizontal axis represents an included angle between the crystal plane and the sample plane, a vertical axis represents a diffraction intensity of the crystal plane at a certain included angle. The rocking curve indicates a crystal quality, and the smaller the FWHM of the rocking curve is, the higher the crystal quality is. In addition, an FWHM indicates an interval between two points whose function values are equal to a half of a peak value of the function.

In the embodiment, the electrode layer 1305 is made of, but not limited to, at least one selected from a group consisting of: molybdenum, ruthenium, tungsten, platinum, iridium and aluminum.

In the embodiment, the sacrificial layer 1307 is made of, but not limited to, at least one selected from a group consisting of: polymer, silicon dioxide, doped silicon dioxide and polysilicon. In the embodiment, the polymer includes, but is not limited to, at least one selected from a group consisting of: BenzoCycloButene (BCB), photosensitive epoxy resin photoresist (such as SU-8), and polyimide. It should be noted that the doped silicon dioxide is silicon dioxide doped with other elements.

In the embodiment, the intermediate layer 1309 is made of, but not limited to, at least one selected from a group consisting of: polymer, and insulating dielectric. In the embodiment, the polymer includes, but is not limited to, at least one selected from a group consisting of: BenzoCycloButene (BCB), photosensitive epoxy resin photoresist (such as SU-8), and polyimide. In the embodiment, the insulating dielectric includes, but is not limited to, at least one selected from a group consisting of: aluminum nitride, silicon dioxide, silicon nitride and titanium oxide. In some embodiments, the intermediate layer 1309 has a thickness ranging from, but is not limited to, 20 μm to 100 μm. It should be noted that an acoustic impedance of the intermediate layer 1309 may be relatively smaller than that of the piezoelectric layer 1303, and the intermediate layer 1309 and the piezoelectric layer 1303 form an acoustic reflection structure to restrain a leakage of acoustic waves from the resonance region.

It should be noted that the piezoelectric layer 1303 is disposed on the substrate 1301, and a surface of the substrate 1301 is flat, which results in the piezoelectric layer 1303 includes crystal grains not suffering from a significant change to their orientation, thus is conducive to improve electromechanical coupling factor of the resonance device and a Q value of the resonance device.

Figure 14:
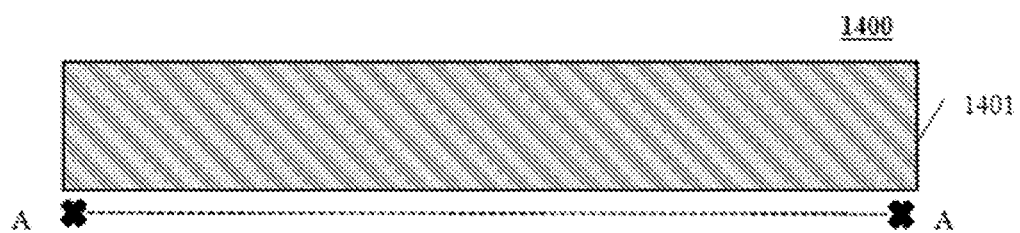

In the embodiment, referring to FIG. 14, the method for forming a bulk acoustic wave resonance device further includes: forming a second stack, and the forming the second stack includes: providing a substrate 1401.

In the embodiment, the substrate 1401 is made of, but not limited to, at least one selected from a group consisting of: silicon, silicon carbide, and glass.

Figure 15:
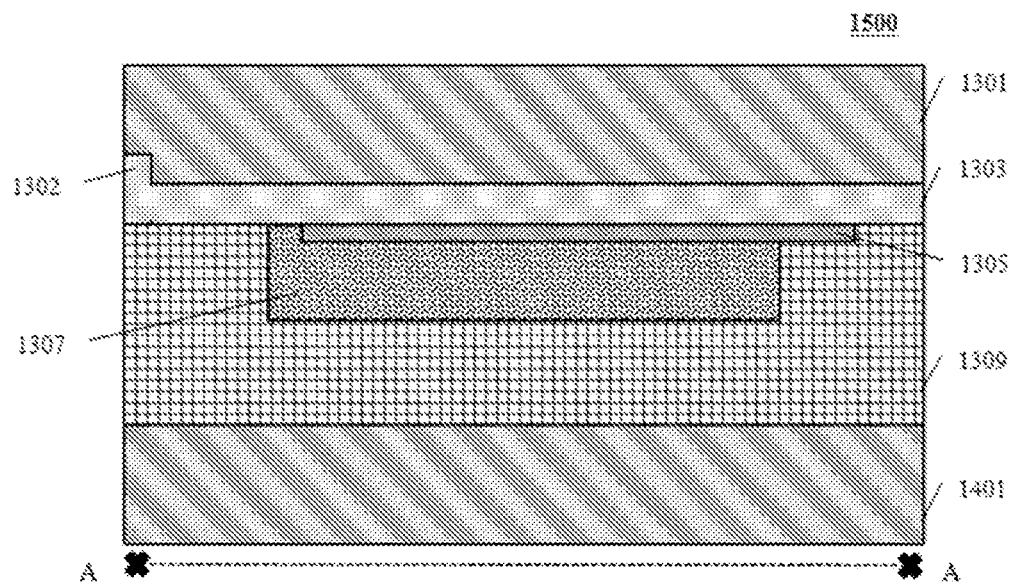

In the embodiment, referring to FIG. 15, the method for forming a bulk acoustic wave resonance device further includes: adhering the intermediate layer 1309 to the substrate 1401.

In the embodiment, the adhering the intermediate layer 1309 to the substrate 1401 includes: applying pressure to the intermediate layer 1309 and the substrate 1401 for adhering the intermediate layer 1309 to the substrate 1401.

Figure 16:
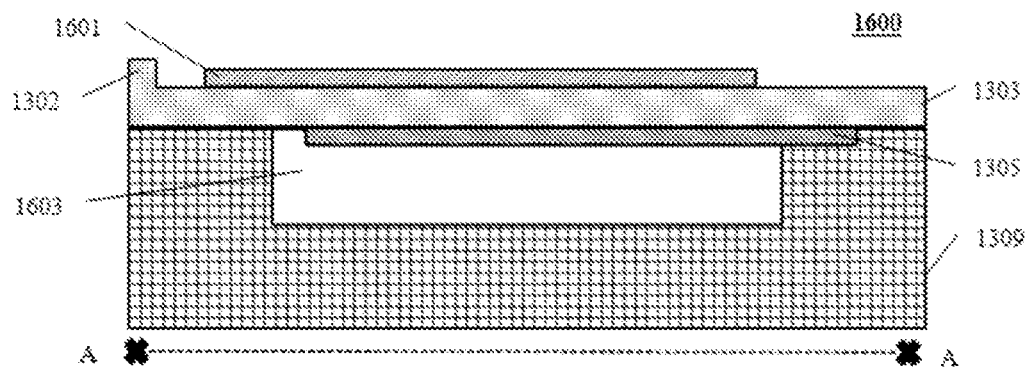

In the embodiment, referring to FIG. 16, the method for forming a bulk acoustic wave resonance device further includes the following steps.

Removing the substrate 1301, retaining the lithographic mark 1302 at an end of the piezoelectric layer 1303, and the lithographic mark 1302 is at a second side of the piezoelectric layer 1303, and the lithographic mark 1302 is in contact with the piezoelectric layer 1303, and the second side is opposite to the first side of the piezoelectric layer 1303.

Forming an electrode layer 1601 at the second side based on the lithographic mark 1302, and the electrode layer 1601 is in contact with the piezoelectric layer 1303.

Etching and removing the sacrificial layer 1307 to form a cavity 1603, and the first end of the electrode layer 1305 is disposed in the cavity 1603.

Polishing and removing the substrate 1401.

In the embodiment, the electrode layer 1601 is made of, but not limited to, at least one selected from a group consisting of: molybdenum, ruthenium, tungsten, platinum, iridium and aluminum.

In the embodiment, the etching method includes, but is not limited to, at least one selected from a group consisting of: oxygen ions etching, xenon difluoride etching and hydrofluoric acid etching.

It should be noted that the lithographic mark 1302 can conduct a calibration, and aligning the disposed electrode layer 1601 with respect to the lithographic mark 1302 can improve the accuracy.

In addition, removing the substrate 1401 can eliminate electrical losses caused by the substrate 1401.

In addition, the electrode layer 1305, the piezoelectric layer 1303 and the electrode layer 1601 form a resonance region, and the resonance region is suspended relative to the cavity 1603 and does not overlap with the intermediate layer 1309.

In general, embodiments of the present disclosure have following benefits:

In summary, in embodiments of the present disclosure, a piezoelectric layer is disposed on a first substrate, and a surface of the first substrate is flat, which results in the piezoelectric layer includes crystal grains not suffering from a significant change to their orientation, thus is conducive to improve electromechanical coupling factor of a resonance device and a Q value of the resonance device In addition, removing a second substrate can eliminate electrical losses caused by the second substrate.

Although the present disclosure is disclosed as above, the present disclosure is not limited to this. Those skilled in the art can make various changes and modifications without departing from the spirit and scope of the present disclosure. Therefore, the protection scope of the present disclosure should be subject to the scope defined by the claims.

What is claimed is:

1. A method for forming a bulk acoustic wave resonance device, comprising:
    forming a first stack, wherein said forming the first stack comprises providing a first substrate;
    forming a piezoelectric layer on the first substrate;
    forming a first electrode layer on the piezoelectric layer;
    forming a cavity preprocessing layer on the piezoelectric layer, wherein a cavity is to be formed based on the cavity preprocessing layer, the cavity preprocessing layer at least covers a first end of the first electrode layer, and the cavity preprocessing layer is in contact with the piezoelectric layer, a first side of the first stack corresponds to a side of the first substrate, and a second side of the first stack corresponds to a side of the cavity preprocessing layer;
    forming a second stack, wherein said forming the second stack comprises providing a second substrate;
    joining the first stack and the second stack, wherein the second stack is disposed at the second side;
    removing the first substrate, wherein the first side corresponds to a side of the piezoelectric layer;
    forming a second electrode layer at the first side, wherein the second electrode layer is in contact with the piezoelectric layer; and
    removing the second stack.

2. The method according to claim 1, wherein said forming the cavity preprocessing layer comprises: forming a sacrificial layer on the piezoelectric layer, and the sacrificial layer covers the first end.

3. The method according to claim 2, wherein the sacrificial layer is made of at least one selected from a group consisting of: polymer, silicon dioxide, doped silicon dioxide and polysilicon.

4. The method according to claim 3, wherein the polymer comprises at least one selected from a group consisting of: benzocyclobutene, photosensitive epoxy resin photoresist, and polyimide.

5. The method according to claim 2, wherein said forming the cavity preprocessing layer further comprises: forming a first intermediate layer on the piezoelectric layer, the first intermediate layer at least covers the sacrificial layer, and the second side corresponds to a side of the first intermediate layer.

6. The method according to claim 5, wherein the first intermediate layer further covers a second end of the first electrode layer.

7. The method according to claim 5, wherein the first intermediate layer is made of at least one selected from a group consisting of: polymer and insulating dielectric.

8. The method according to claim 7, wherein the polymer comprises at least one selected from a group consisting of: benzocyclobutene, photosensitive epoxy resin photoresist, and polyimide.

9. The method according to claim 7, wherein the insulating dielectric comprises at least one selected from a group consisting of: aluminum nitride, silicon dioxide, silicon nitride and titanium oxide.

10. The method according to claim 5, wherein the first intermediate layer has a thickness ranging from 20 μm to 100 μm.

11. The method according to claim 5, wherein said joining the first stack and the second stack comprises: adhering the first intermediate layer to the second substrate.

12. The method according to claim 11, wherein said removing the second stack comprises: polishing and removing the second substrate.

13. The method according to claim 5, wherein said forming the second stack further comprises: forming a second intermediate layer on the second substrate.

14. The method according to claim 13, wherein the second intermediate layer is made of a chemical substance with low surface energy.

15. The method according to claim 14, wherein the chemical substance with low surface energy comprises at least one selected from a group consisting of: 1H, 1H,2H, 2H-perfluoroheptadecane trimethoxysilane, polydimethylsiloxane, hydrocarbons, fluorocarbons, polyethylene, polypropylene, and polytetrafluoroethylene.

16. The method according to claim 13, wherein said joining the first stack and the second stack comprises: adhering the first intermediate layer to the second intermediate layer.

17. The method according to claim 16, wherein said removing the second stack comprises: separating the first intermediate layer and the second intermediate layer, and removing the second intermediate layer and the second substrate.

18. The method according to claim 5, further comprising: removing the sacrificial layer for forming the cavity, wherein the first end is disposed in the cavity.

19. The method according to claim 5, wherein said forming the cavity preprocessing layer further comprises: before forming the first intermediate layer, forming an etching shield layer on the piezoelectric layer, and the etching shield layer at least covers the sacrificial layer.

20. The method according to claim 19, wherein the etching shield layer is made of at least one selected from a group consisting of: aluminum nitride, silicon carbide, diamond, silicon nitride, silicon dioxide, alumina, and titanium dioxide.

21. The method according to claim 19, wherein the etching shield layer has a thickness ranging from 2 μm to 6 μm.

22. The method according to claim 1, wherein said forming the second stack further comprises: forming a second intermediate layer on the second substrate.

23. The method according to claim 22, wherein the second intermediate layer is made of a chemical substance with low surface energy.

24. The method according to claim 23, wherein the chemical substance with low surface energy comprises at least one selected from a group consisting of: 1H, 1H,2H, 2H-perfluoroheptadecane trimethoxysilane, polydimethylsiloxane, hydrocarbons, fluorocarbons, polyethylene, polypropylene, and polytetrafluoroethylene.

25. The method according to claim 22, wherein said joining the first stack and the second stack comprises: adhering the cavity preprocessing layer to the second intermediate layer.

26. The method according to claim 25, wherein said removing the second stack comprises: separating the cavity preprocessing layer and the second intermediate layer, and removing the second intermediate layer and the second substrate.

27. The method according to claim 1, wherein the piezoelectric layer comprises a plurality of crystal grains, the plurality of crystals comprise a first crystal grain and a second crystal grain, wherein the first crystal grain and the second crystal grain are any two crystal grains among the plurality of crystal grains; and a first coordinate axis along a first direction corresponds to a height of the first crystal grain, and a second coordinate axis along a second direction corresponds to a height of the second crystal grain, wherein the first direction and the second direction are the same or opposite.

28. The method according to claim 27, wherein the first crystal grain corresponds to the first coordinate system, the first coordinate system comprises the first coordinate axis and a third coordinate axis along a third direction; the second crystal grain corresponds to the second coordinate system, the second coordinate system comprises the second coordinate axis and a fourth coordinate axis along a fourth direction.

29. The method according to claim 28, wherein the first coordinate system also comprises a fifth coordinate axis along a fifth direction, the second coordinate system also comprises a sixth coordinate axis along a sixth direction.

30. The method according to claim 29, wherein the third direction and the fourth direction are the same or opposite.

31. The method according to claim 1, wherein the piezoelectric layer is made of at least one selected from a group consisting of: aluminum nitride aluminum nitride alloy, gallium nitride, zinc oxide, lithium tantalate, lithium niobate, lead zirconate titanate, and lead magnesium niobate-lead titanate.

32. The method according to claim 1, wherein the piezoelectric layer comprises a plurality of crystal grains, and a Full Width at Half Maximum (FWHM) of a rocking curve of a crystal made of the plurality of crystal grains is lower than 2.5 degrees.

33. The method according to claim 1, wherein said forming the piezoelectric layer comprises: forming a first sub-piezoelectric layer on the first substrate; and forming a second sub-piezoelectric layer on the first sub-piezoelectric layer.

34. The method according to claim 33, wherein an FWHM of a rocking curve of the first sub-piezoelectric layer is higher than 1.7 degrees; an FWHM of a rocking curve of the second sub-piezoelectric layer is lower than 1.7 degrees.

35. The method according to claim 33, further comprising: removing the first sub-piezoelectric layer after removing the first substrate, wherein the first side corresponds to a side of the second sub-piezoelectric layer.

36. The method according to claim 1, wherein said forming the first stack further comprises: forming a lithographic mark before forming the piezoelectric layer.

37. The method according to claim 36, wherein said forming the lithographic mark comprises: forming an opening at an end of the first substrate; and forming the lithographic mark in the opening.

38. The method according to claim 36, further comprising: after removing the first substrate, the lithographic mark is retained at the first side, wherein the lithographic mark is in contact with the piezoelectric layer.

39. The method according to claim 1, further comprising: before forming the second electrode layer, forming a periphery structure at the first side, wherein the periphery structure is in contact with the piezoelectric layer.

40. The method according to claim 39, wherein said forming the second electrode layer comprises: forming a second electrode layer at an inner side of the periphery structure.

41. The method according to claim 39, wherein said forming the periphery structure comprises: forming a metal periphery structure at the first side, wherein the metal periphery structure is in contact with the piezoelectric layer.

42. The method according to claim 41, wherein said forming the periphery structure further comprises: etching an inner side of the metal periphery structure to form a slope.

43. The method according to claim 42, wherein an etching angle for etching the inner side of the metal periphery structure is within a range from 1 degree to 89 degrees.

* * * * *